United States Patent
Goodchild et al.

(10) Patent No.: US 11,296,550 B2
(45) Date of Patent: Apr. 5, 2022

(54) DETECTION OF DEVICE REMOVAL FROM A SURFACE OF A MULTI-COIL WIRELESS CHARGING DEVICE

(71) Applicant: AIRA, Inc., Chandler, AZ (US)

(72) Inventors: Eric Heindel Goodchild, Phoenix, AZ (US); John Winters, Chandler, AZ (US); James Scott, Chandler, AZ (US)

(73) Assignee: AIRA, INC., Chandler, AZ (US)

( * ) Notice: Subject to any disclaimer, the term of this patent is extended or adjusted under 35 U.S.C. 154(b) by 18 days.

(21) Appl. No.: 16/936,361

(22) Filed: Jul. 22, 2020

(65) Prior Publication Data

US 2021/0028651 A1 Jan. 28, 2021

Related U.S. Application Data

(60) Provisional application No. 63/019,245, filed on May 1, 2020, provisional application No. 63/019,241, filed
(Continued)

(51) Int. Cl.
*H02J 50/90* (2016.01)
*H02J 50/12* (2016.01)
(Continued)

(52) U.S. Cl.
CPC ............... *H02J 50/12* (2016.02); *G01L 1/22* (2013.01); *G01P 15/00* (2013.01); *G01R 19/12* (2013.01);
(Continued)

(58) Field of Classification Search
CPC ...................................................... H02J 50/12
(Continued)

(56) References Cited

U.S. PATENT DOCUMENTS

| 4,937,719 A | 6/1990 | Yamada et al. |
| 5,202,617 A * | 4/1993 | Nor ............... H02J 7/00036 320/130 |

(Continued)

FOREIGN PATENT DOCUMENTS

| GB | 2414120 A * | 11/2005 | ............... H02J 50/80 |
| WO | 2014160759 A2 | 10/2014 | |

OTHER PUBLICATIONS

PCT/US2020/043344. Int'l Search Report & Written Opinion (dated Oct. 15, 2020).
(Continued)

*Primary Examiner* — Edward Tso
*Assistant Examiner* — Ahmed H Omar
(74) *Attorney, Agent, or Firm* — Loza & Loza, LLP; Anthony Smyth

(57) ABSTRACT

Systems, methods and apparatus for wireless charging are disclosed. A charging device has a plurality of charging cells provided on a charging surface, a charging circuit and a controller. The controller may be configured to cause the charging circuit to provide a charging current to a resonant circuit when a receiving device is placed on the charging surface, provide a measurement slot by causing the charging circuit to decrease or terminate the charging current for a period of time and determine whether the receiving device has been removed from the charging surface based on measurement of a characteristic of the resonant circuit during the measurement slot. The characteristic of the resonant circuit may be representative of electromagnetic coupling between a transmitting coil in the resonant circuit and a receiving coil in the receiving device.

22 Claims, 28 Drawing Sheets

Related U.S. Application Data on May 1, 2020, provisional application No. 63/019,248, filed on May 1, 2020, provisional application No. 62/877,831, filed on Jul. 23, 2019.

(51) Int. Cl.

| | | |
|---|---|---|
| *G01L 1/22* | (2006.01) | |
| *G01P 15/00* | (2006.01) | |
| *G01V 3/08* | (2006.01) | |
| *G01V 8/12* | (2006.01) | |
| *G01V 1/00* | (2006.01) | |
| *H02J 7/04* | (2006.01) | |
| *H02J 7/00* | (2006.01) | |
| *G01R 19/12* | (2006.01) | |
| *H02J 50/23* | (2016.01) | |
| *H02J 50/40* | (2016.01) | |

(52) U.S. Cl.
CPC ............. *G01V 1/00* (2013.01); *G01V 3/081* (2013.01); *G01V 8/12* (2013.01); *H02J 7/0047* (2013.01); *H02J 7/04* (2013.01); *H02J 50/23* (2016.02); *H02J 50/40* (2016.02); *H02J 50/402* (2020.01); *H02J 50/90* (2016.02); *H02J 7/00718* (2020.01); *H02J 7/007184* (2020.01)

(58) Field of Classification Search
USPC ........................................................ 320/108
See application file for complete search history.

(56) References Cited

U.S. PATENT DOCUMENTS

| | | |
|---|---|---|
| 8,368,346 B2 | 2/2013 | Batson et al. |
| 9,425,640 B2 | 8/2016 | Moran |
| 2005/0084754 A1 | 4/2005 | Klein |
| 2010/0084918 A1* | 4/2010 | Fells ................. H02J 50/12 307/32 |
| 2013/0062959 A1 | 3/2013 | Lee et al. |
| 2014/0132206 A1 | 5/2014 | Zhu |
| 2014/0312836 A1 | 10/2014 | Lundgren et al. |
| 2015/0177330 A1 | 6/2015 | Morris |
| 2016/0020642 A1 | 1/2016 | Liu et al. |
| 2016/0134155 A1 | 5/2016 | Bennett |
| 2020/0274396 A1* | 8/2020 | Smith ................ H01F 27/28 |

OTHER PUBLICATIONS

PCT/US2020/043345. Int'l Search Report & Written Opinion (dated Oct. 15, 2020).

PCT/US2020/043343. Int'l Search Report & Written Opinion (dated Nov. 18, 2020).

\* cited by examiner

DETECTION OF DEVICE REMOVAL FROM A SURFACE OF A MULTI-COIL WIRELESS CHARGING DEVICE

PRIORITY CLAIM

This application claims priority to and the benefit of provisional patent application No. 62/877,831 filed in the United States Patent Office on Jul. 23, 2019, of provisional patent application No. 63/019,241 filed in the United States Patent Office on May 1, 2020, of provisional patent application No. 63/019,245 filed in the United States Patent Office on May 1, 2020, and of provisional patent application No. 63/019,248 filed in the United States Patent Office on May 1, 2020, the entire content of which applications are incorporated herein by reference as if fully set forth below in their entirety and for all applicable purposes.

TECHNICAL FIELD

The present invention relates generally to wireless charging of batteries, including batteries in mobile computing devices, and more particularly to detection of device removal during a charging operation.

BACKGROUND

Wireless charging systems have been deployed to enable certain types of devices to charge internal batteries without the use of a physical charging connection. Devices that can take advantage of wireless charging include mobile processing and/or communication devices. Standards, such as the Qi standard defined by the Wireless Power Consortium enable devices manufactured by a first supplier to be wirelessly charged using a charger manufactured by a second supplier. Standards for wireless charging are optimized for relatively simple configurations of devices and tend to provide basic charging capabilities.

Improvements in wireless charging capabilities are required to support continually increasing complexity of mobile devices and changing form factors. For example, there is a need for a faster, lower power detection techniques that enable a charging device to detect and locate chargeable devices on a surface of a charging device, and to detect removal or relocation of a chargeable device during a wireless charging operation.

DETAILED DESCRIPTION

Figure 1:
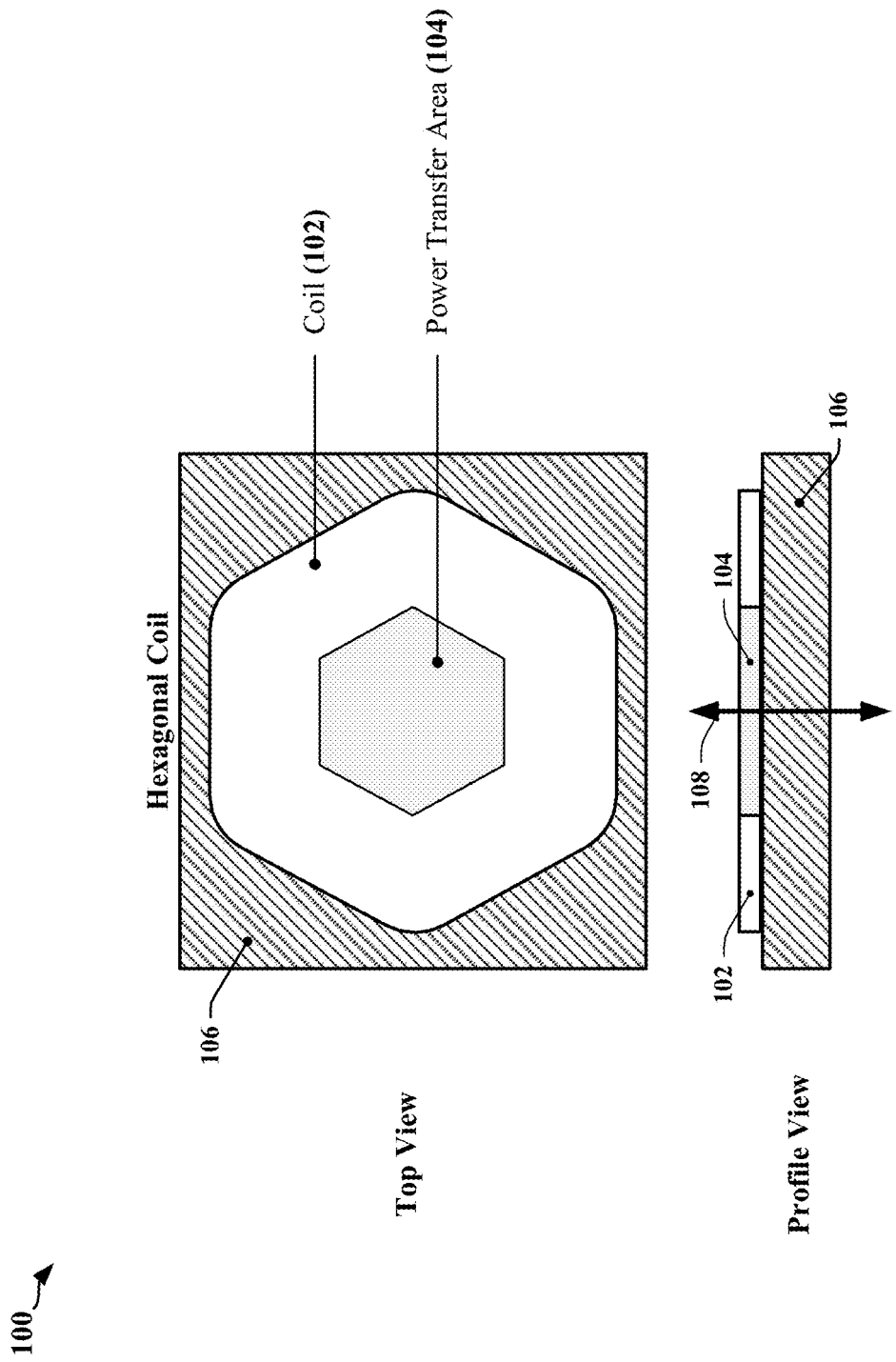
FIG. 1 illustrates an example of a charging cell that may be provided on a charging surface provided by a wireless charging device in accordance with certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of wireless charging systems will now be presented with reference to various apparatus and methods. These apparatus and methods will be described in the following detailed description and illustrated in the accompanying drawing by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a processor-readable storage medium. A processor-readable storage medium, which may also be referred to herein as a computer-readable medium may include, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), Near Field Communications (NFC) token, random access memory (RAM), read only memory (ROM), programmable ROM (PROM), erasable PROM (EPROM), electrically erasable PROM (EEPROM), a register, a removable disk, a carrier wave, a transmission line, and any other suitable medium for storing or transmitting software. The computer-readable medium may be resident in the processing system, external to the processing system, or distributed across multiple entities including the processing system. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

Overview

Certain aspects of the present disclosure relate to systems, apparatus and methods applicable to wireless charging devices and techniques. Charging cells may be configured with one or more inductive coils to provide a charging surface in a charging device where the charging surface enables the charging device to charge one or more chargeable devices wirelessly. The location of a device to be charged may be detected through sensing techniques that associate location of the device to changes in a physical characteristic centered at a known location on the charging surface. Sensing of location may be implemented using capacitive, resistive, inductive, touch, pressure, load, strain, and/or another appropriate type of sensing.

In one aspect of the disclosure, an apparatus has a battery charging power source, a plurality of charging cells configured in a matrix, a first plurality of switches in which each switch is configured to couple a row of coils in the matrix to a first terminal of the battery charging power source, and a second plurality of switches in which each switch is configured to couple a column of coils in the matrix to a second terminal of the battery charging power source. Each charging cell in the plurality of charging cells may include one or more coils surrounding a power transfer area. The plurality of charging cells may be arranged adjacent to the charging surface of the charging device without overlap of power transfer areas of the charging cells in the plurality of charging cells.

In some instances, the apparatus may also be referred to as a charging surface. Power can be wirelessly transferred to a receiving device located anywhere on a surface of the apparatus. The devices can have an arbitrarily defined size and/or shape and may be placed without regard to any discrete placement locations enabled for charging. Multiple devices can be simultaneously charged on a single charging surface. The apparatus can track motion of one or more devices across the charging surface.

Charging Cells

According to certain aspects disclosed herein, a charging surface may be provided using charging cells in a charging device, where the charging cells are deployed adjacent to the charging surface. In one example the charging cells are deployed in one or more layers of the charging surface in accordance with a honeycomb packaging configuration. A charging cell may be implemented using one or more coils that can each induce a magnetic field along an axis that is substantially orthogonal to the charging surface adjacent to the coil. In this description, a charging cell may refer to an element having one or more coils where each coil is configured to produce an electromagnetic field that is additive with respect to the fields produced by other coils in the charging cell and directed along or proximate to a common axis.

In some implementations, a charging cell includes coils that are stacked along a common axis and/or that overlap such that they contribute to an induced magnetic field substantially orthogonal to the charging surface. In some implementations, a charging cell includes coils that are arranged within a defined portion of the charging surface and that contribute to an induced magnetic field within the substantially orthogonal portion of the charging surface associated with the charging cell. In some implementations, charging cells may be configurable by providing an activating current to coils that are included in a dynamically-defined charging cell. For example, a charging device may include multiple stacks of coils deployed across the charging surface, and the charging device may detect the location of a device to be charged and may select some combination of stacks of coils to provide a charging cell adjacent to the device to be charged. In some instances, a charging cell may include, or be characterized as a single coil. However, it should be appreciated that a charging cell may include multiple stacked coils and/or multiple adjacent coils or stacks of coils. The coils may be referred to herein as charging coils, wireless charging coils, transmitter coils, transmitting coils, power transmitting coils, power transmitter coils, or the like.

FIG. 1 illustrates an example of a charging cell 100 that may be deployed and/or configured to provide a charging surface of a charging device. As described herein, the charging surface may include an array of charging cells 100 provided on one or more substrates 106. A circuit comprising one or more integrated circuits (ICs) and/or discrete electronic components may be provided on one or more of the substrates 106. The circuit may include drivers and switches used to control currents provided to coils used to transmit power to a receiving device. The circuit may be configured as a processing circuit that includes one or more processors and/or one or more controllers that can be configured to perform certain functions disclosed herein. In some instances, some or all of the processing circuit may be provided external to the charging device. In some instances, a power supply may be coupled to the charging device.

The charging cell 100 may be provided in close proximity to an outer surface area of the charging device, upon which one or more devices can be placed for charging. The charging device may include multiple instances of the charging cell 100. In one example, the charging cell 100 has a substantially hexagonal shape that encloses one or more coils 102, which may be constructed using conductors, wires or circuit board traces that can receive a current sufficient to produce an electromagnetic field in a power transfer area 104. In various implementations, some coils 102 may have a shape that is substantially polygonal, including the hexagonal charging cell 100 illustrated in FIG. 1. Other implementations provide coils 102 that have other shapes. The shape of the coils 102 may be determined at least in part by the capabilities or limitations of fabrication technology, and/or to optimize layout of the charging cells on a substrate 106 such as a printed circuit board substrate. Each coil 102 may be implemented using wires, printed circuit board traces and/or other connectors in a spiral configuration. Each charging cell 100 may span two or more layers separated by an insulator or substrate 106 such that coils 102 in different layers are centered around a common axis 108.

Figure 2:
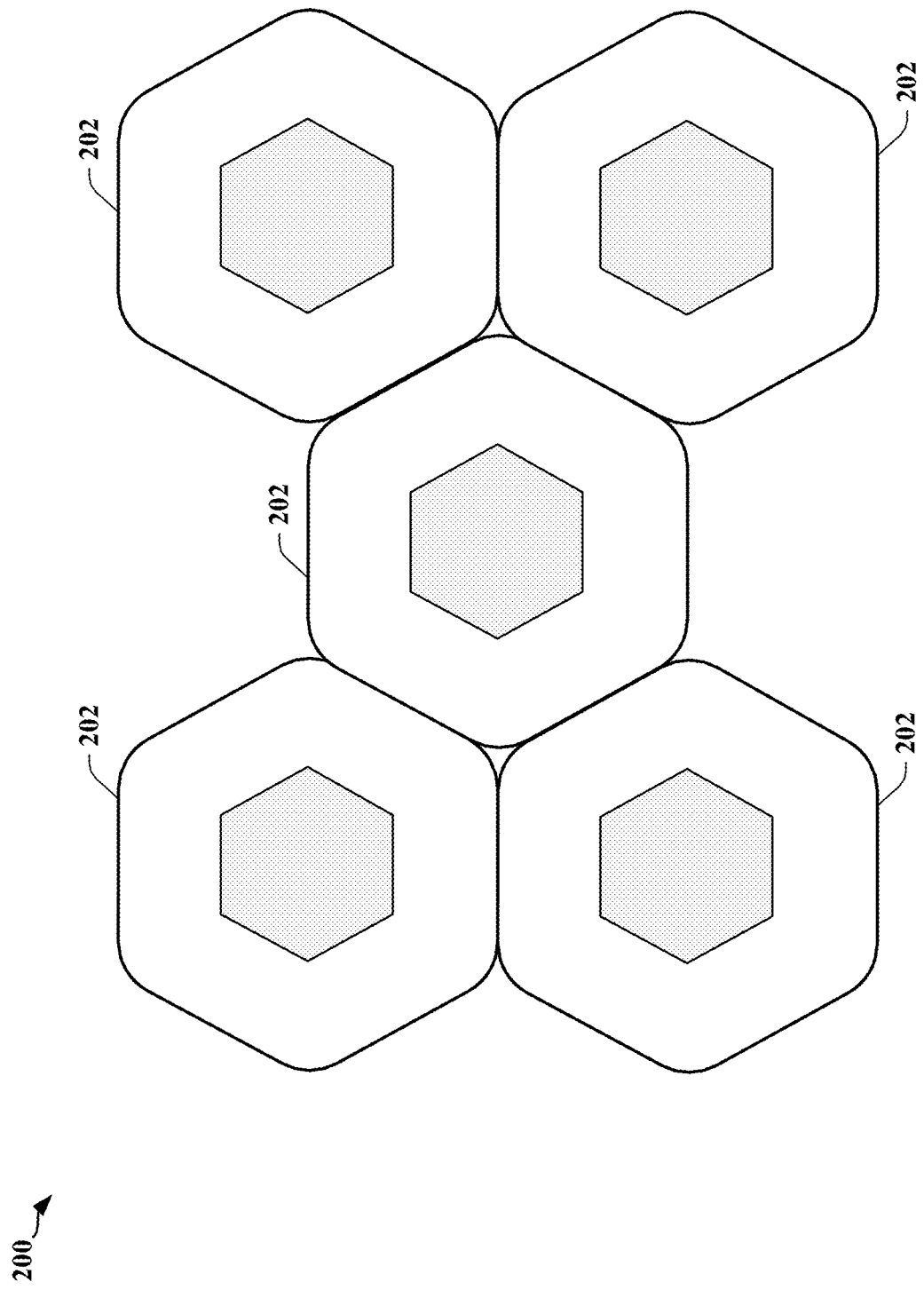
FIG. 2 illustrates an example of an arrangement of charging cells provided on a single layer of a segment of a charging surface provided by a wireless charging device in accordance with certain aspects disclosed herein.

FIG. 2 illustrates an example of an arrangement 200 of charging cells 202 provided on a single layer of a segment of a charging surface of a charging device that may be adapted in accordance with certain aspects disclosed herein. The charging cells 202 are arranged according to a honeycomb packaging configuration. In this example, the charging cells 202 are arranged end-to-end without overlap. This arrangement can be provided without through-hole or wire interconnects. Other arrangements are possible, including arrangements in which some portion of the charging cells 202 overlap. For example, wires of two or more coils may be interleaved to some extent.

Figure 3:
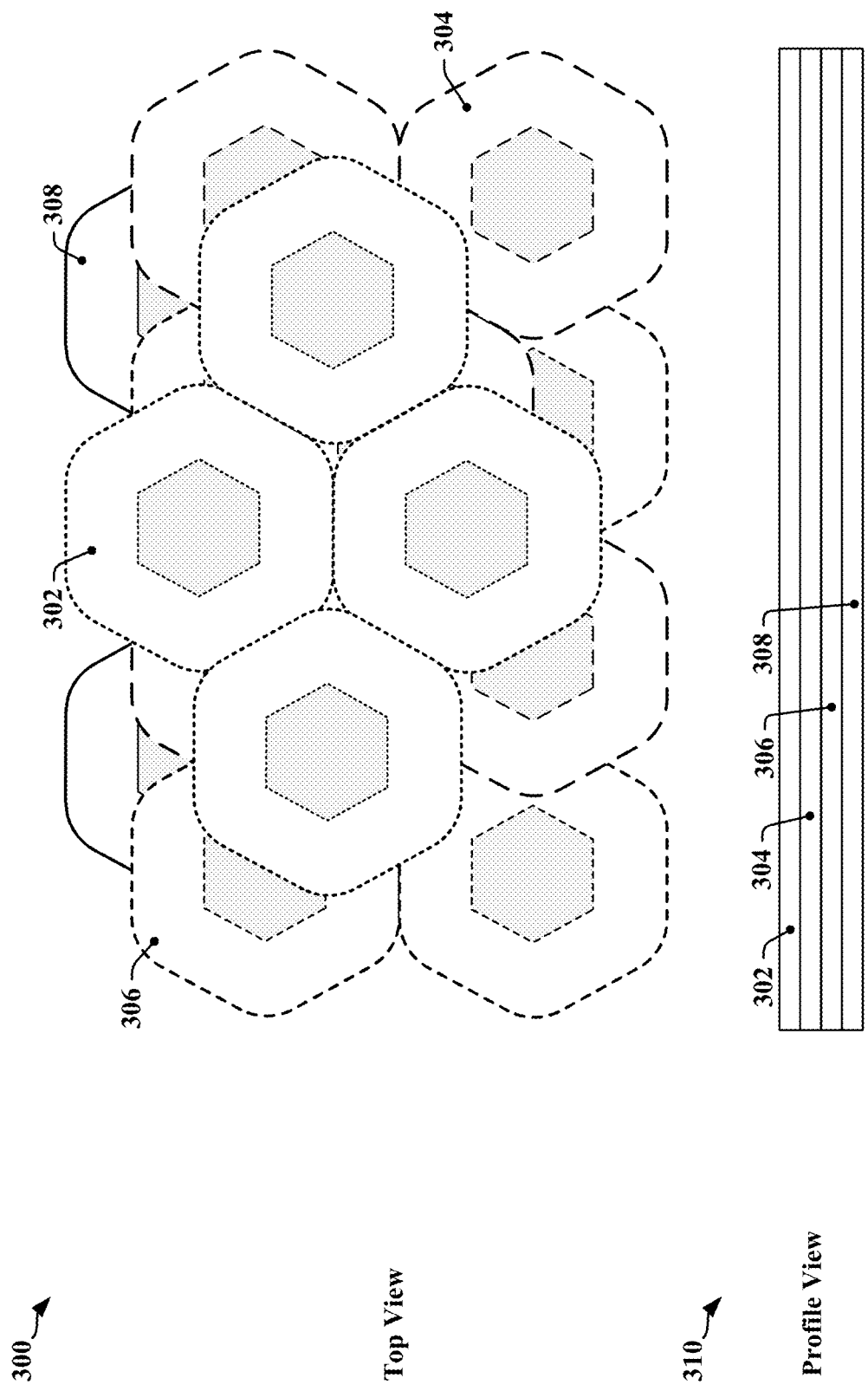
FIG. 3 illustrates an example of an arrangement of charging cells when multiple layers of charging cells are overlaid within a segment of a charging surface provided by a wireless charging device in accordance with certain aspects disclosed herein.

FIG. 3 illustrates an example of an arrangement of charging cells from two perspectives 300, 310 when multiple layers are overlaid within a segment of a charging surface that may be adapted in accordance with certain aspects disclosed herein. Layers of charging cells 302, 304, 306, 308 are provided within a segment of a charging surface. The charging cells within each layer of charging cells 302, 304, 306, 308 are arranged according to a honeycomb packaging configuration. In one example, the layers of charging cells 302, 304, 306, 308 may be formed on a printed circuit board that has four or more layers. The arrangement of charging cells 100 can be selected to provide complete coverage of a designated charging area that is adjacent to the illustrated segment.

Figure 4:
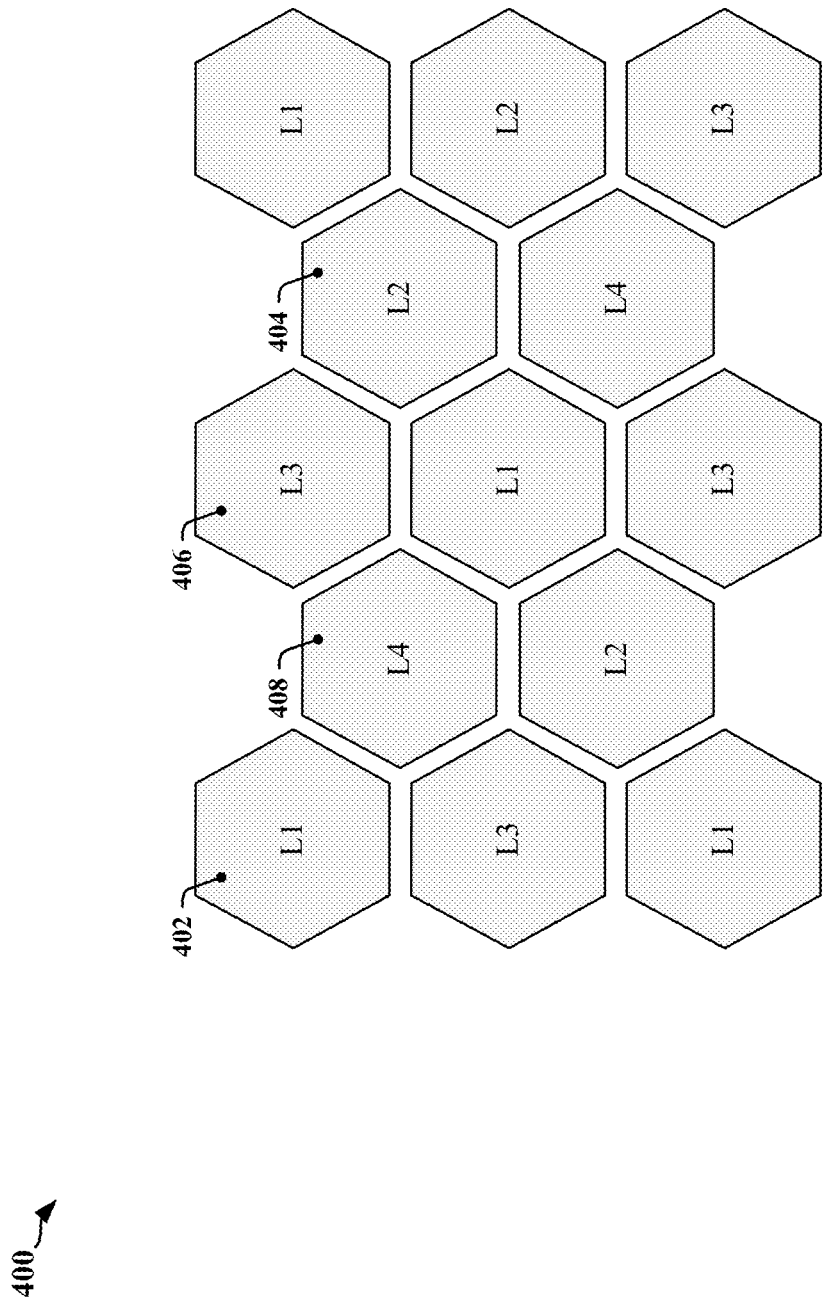
FIG. 4 illustrates the arrangement of power transfer areas provided by a charging surface of a charging device that employs multiple layers of charging cells configured in accordance with certain aspects disclosed herein.

FIG. 4 illustrates the arrangement of power transfer areas provided in a charging surface 400 that employs multiple layers of charging cells configured in accordance with certain aspects disclosed herein. The illustrated charging surface is constructed from four layers of charging cells 402, 404, 406, 408. In FIG. 4, each power transfer area provided by a charging cell in the first layer of charging cells 402 is marked "L1", each power transfer area provided by a charging cell in the second layer of charging cells 404 is marked "L2", each power transfer area provided by a charging cell in the third layer of charging cells 406 is marked "L3", and each power transfer area provided by a charging cell in the fourth layer of charging cells 408 is marked "L4".

Wireless Transmitter

Figure 5:
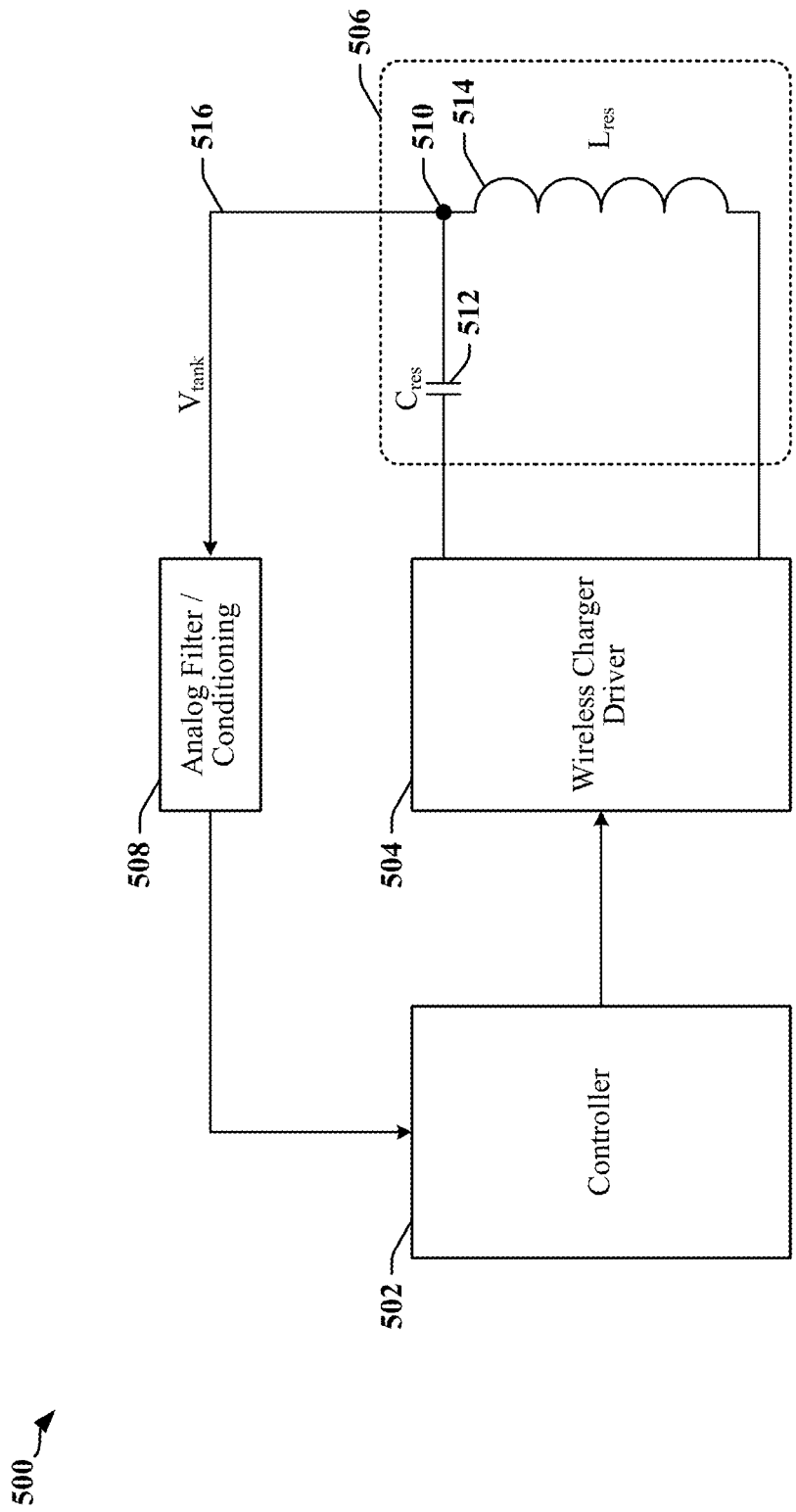
FIG. 5 illustrates a wireless transmitter that may be provided in a charger base station in accordance with certain aspects disclosed herein.

FIG. 5 illustrates a wireless transmitter 500 that may be provided in a charger base station. A controller 502 may receive a feedback signal filtered or otherwise processed by a conditioning circuit 508. The controller may control the operation of a driver circuit 504 that provides an alternating current to a resonant circuit 506 that includes a capacitor 512 and inductor 514. The resonant circuit 506 may also be referred to herein as a tank circuit, LC tank circuit, or LC tank, and the voltage 516 measured at an LC node 510 of the resonant circuit 506 may be referred to as the tank voltage.

The wireless transmitter 500 may be used by a charging device to determine if a compatible device has been placed on a charging surface. For example, the charging device may determine that a compatible device has been placed on the charging surface by sending an intermittent test signal (active ping) through the wireless transmitter 500, where the resonant circuit 506 may detect or receive encoded signals when a compatible device responds to the test signal. The charging device may be configured to activate one or more coils in at least one charging cell after receiving a response signal defined by standard, convention, manufacturer or application. In some examples, the compatible device can respond to a ping by communicating received signal strength such that the charging device can find an optimal charging cell to be used for charging the compatible device.

Passive ping techniques may use the voltage and/or current measured or observed at the LC node 510 to identify the presence of a receiving coil in proximity to the charging pad of a device adapted in accordance with certain aspects disclosed herein. In many conventional wireless charger transmitters, circuits are provided to measure voltage at the LC node 510 or to measure the current in the LC network. These voltages and currents may be monitored for power regulation purposes or to support communication between devices. In the example illustrated in FIG. 5, voltage at the LC node 510 is monitored, although it is contemplated that current may additionally or alternatively be monitored to support passive ping in which a short pulse is provided to the resonant circuit 506. A response of the resonant circuit 506 to a passive ping (initial voltage $V_0$) may be represented by the voltage ($V_{LC}$) at the LC node 510, such that:

$$V_{LC} = V_0 e^{-\left(\frac{\omega}{2Q}\right)t}. \quad \text{(Eq. 1)}$$

According to certain aspects disclosed herein, coils in one or more charging cells may be selectively activated to provide an optimal electromagnetic field for charging a compatible device. In some instances, coils may be assigned to charging cells, and some charging cells may overlap other charging cells. In the latter instances, the optimal charging configuration may be selected at the charging cell level. In other instances, charging cells may be defined based on placement of a device to be charged on a surface of the charging device. In these other instances, the combination of coils activated for each charging event can vary. In some implementations, a charging device may include a driver circuit that can select one or more cells and/or one or more predefined charging cells for activation during a charging event.

Figure 6:
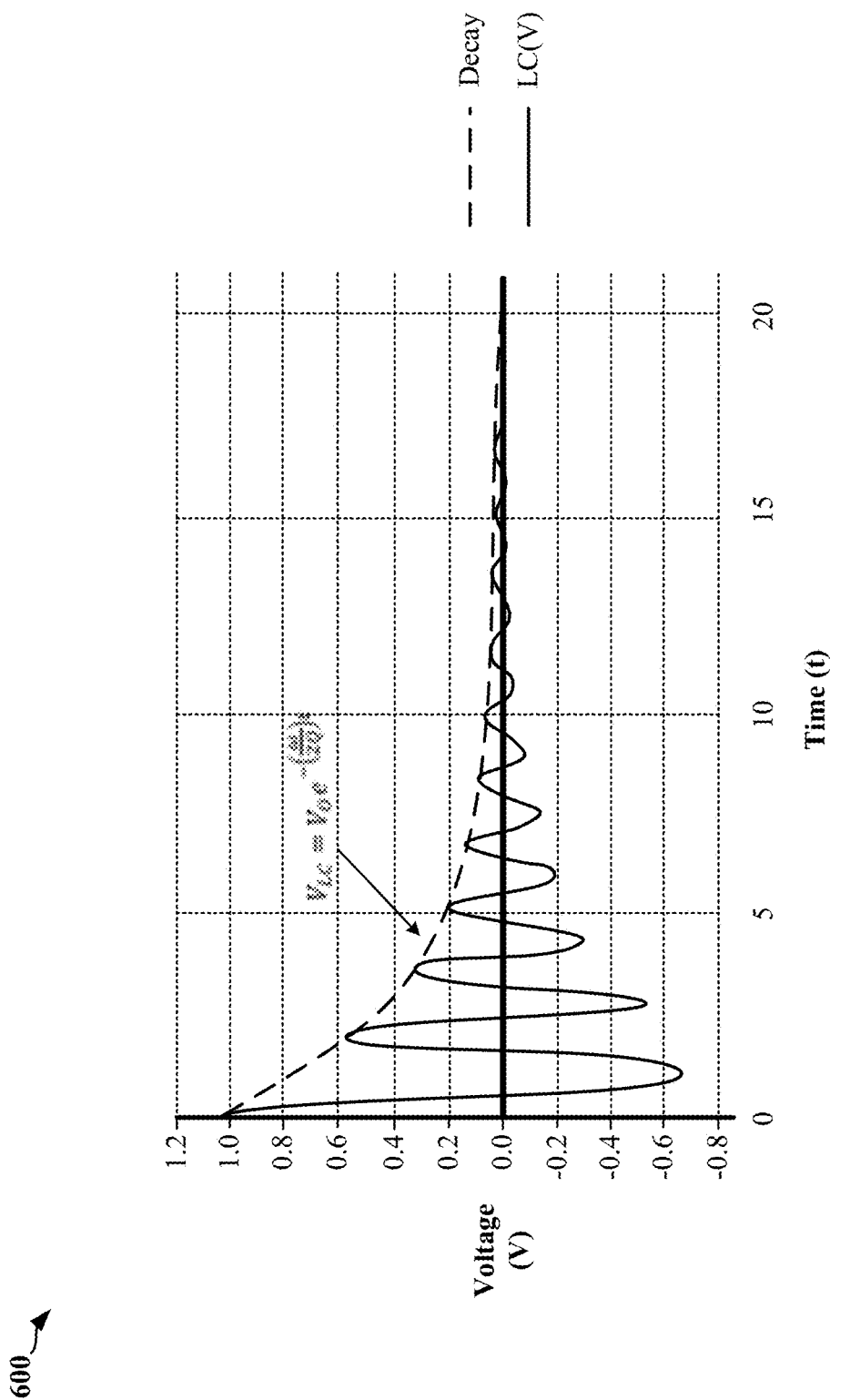
FIG. 6 illustrates a first example of a response to a passive ping in accordance with certain aspects disclosed herein.

FIG. 6 illustrates a first example in which a response 600 to a passive ping decays according to Equation 3. After the excitation pulse at time t=0, the voltage and/or current is seen to oscillate at the resonant frequency defined by Equation 1, and with a decay rate defined by Equation 3. The first cycle of oscillation begins at voltage level $V_0$ and $V_{LC}$ continues to decay to zero as controlled by the Q factor and ω. The example illustrated in FIG. 6 represents a typical open or unloaded response when no object is present or proximate to the charging pad. In FIG. 6 the value of the Q factor is assumed to be 20.

Figure 7:
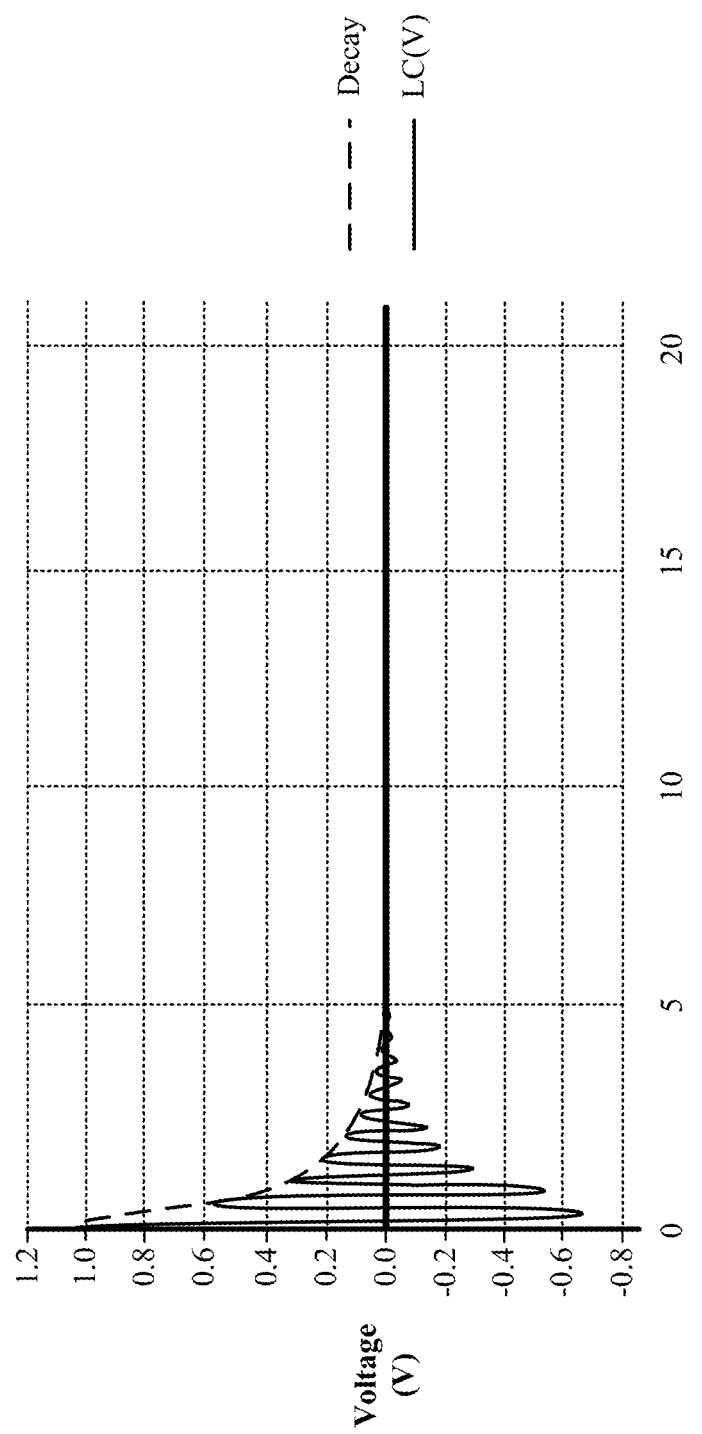
FIG. 7 illustrates a second example of a response to a passive ping in accordance with certain aspects disclosed herein.

FIG. 7 illustrates a second example in which a response 700 to a passive ping decays according to Equation 3. After the excitation pulse at time=0, the voltage and/or current is seen to oscillate at the resonant frequency defined by Equation 1, and with a decay rate defined by Equation 3. The first cycle of oscillation begins at voltage level $V_0$ and $V_{LC}$ continues to decay to zero as controlled by the Q factor and ω. The example illustrated in FIG. 7 represents a loaded response when an object is present or proximate to the charging pad loads the coil. In FIG. 7 the Q factor may have a value of 7. $V_{LC}$ oscillates at a higher in the response 700 with respect to the response 600.

Figure 8:
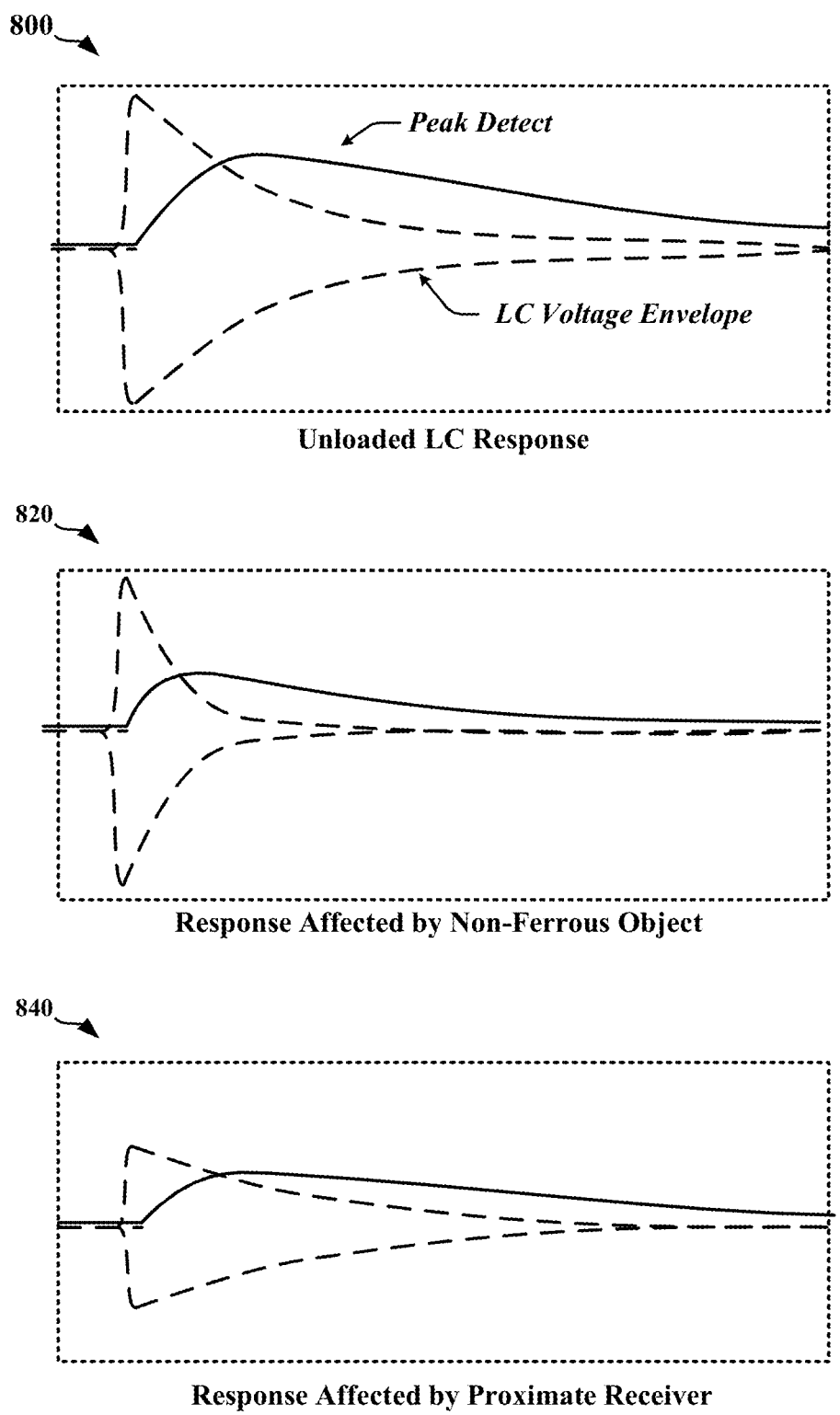
FIG. 8 illustrates examples of observed differences in responses to a passive ping in accordance with certain aspects disclosed herein.

FIG. 8 illustrates a set of examples in which differences in responses 800, 820, 840 may be observed. A passive ping is initiated when a driver circuit 504 excites the resonant circuit 506 using a pulse that is shorter than 2.5 μs. Different types of wireless receivers and foreign objects placed on the transmitter result in different responses observable in the voltage at the LC node 510 or current in the resonant circuit 506 of the transmitter. The differences may indicate variations in the Q factor of the resonant circuit 506 frequency of the oscillation of $V_0$. Table 1 illustrates certain examples of objects placed on the charging pad in relation to an open state.

TABLE 1

| Object | Frequency | $V_{peak}$ (mV) | 50% Decay Cycles | Q Factor |
|---|---|---|---|---|
| None present | 96.98 kHz | 134 mV | 4.5 | 20.385 |
| Type-1 Receiver | 64.39 kHz | 82 mV | 3.5 | 15.855 |
| Type-2 Receiver | 78.14 kHz | 78 mV | 3.5 | 15.855 |
| Type-3 Receiver | 76.38 kHz | 122 mV | 3.2 | 14.496 |
| Misaligned Type-3 Receiver | 210.40 kHz | 110 mV | 2.0 | 9.060 |
| Ferrous object | 93.80 kHz | 110 mV | 2.0 | 9.060 |
| Non-ferrous object | 100.30 kHz | 102 mV | 1.5 | 6.795 |

In Table 1, the Q factor may be calculated as follows:

$$Q = \frac{\pi N}{\ln(2)} \cong 4.53N, \quad \text{(Eq. 2)}$$

where N is the number of cycles from excitation until amplitude falls below 0.5 $V_0$.

Selectively Activating Coils

According to certain aspects disclosed herein, transmitting coils in one or more charging cells may be selectively activated to provide an optimal electromagnetic field for charging a compatible device. In some instances, transmitting coils may be assigned to charging cells, and some charging cells may overlap other charging cells. In the latter instances, the optimal charging configuration may be selected at the charging cell level. In other instances, charging cells may be defined based on placement of a device to be charged on a charging surface. In these other instances, the combination of coils activated for each charging event can vary. In some implementations, a charging device may include a driver circuit that can select one or more cells and/or one or more predefined charging cells for activation during a charging event.

Figure 9:
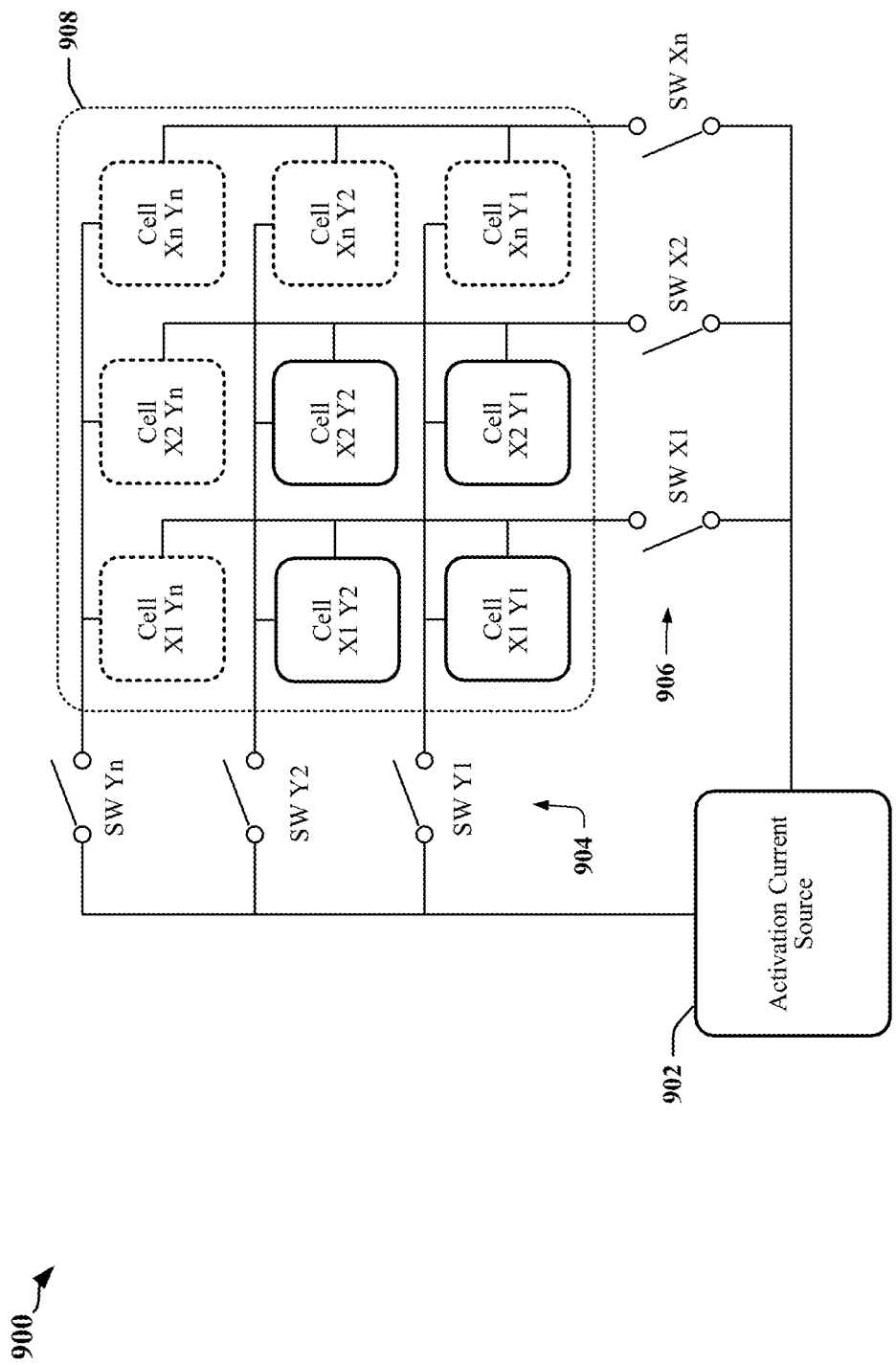
FIG. 9 illustrates a first topology that supports matrix multiplexing switching for use in a wireless charger adapted in accordance with certain aspects disclosed herein.

FIG. 9 illustrates a first topology 900 that supports matrix multiplexing switching for use in a wireless charger adapted in accordance with certain aspects disclosed herein. The wireless charger may select one or more charging cells 100 to charge a receiving device. Charging cells 100 that are not in use can be disconnected from current flow. A relatively large number of charging cells 100 may be used in the honeycomb packaging configuration illustrated in FIG. 2 requiring a corresponding number of switches. According to certain aspects disclosed herein, the charging cells 100 may be logically arranged in a matrix 908 having multiple cells connected to two or more switches that enable specific cells to be powered. In the illustrated topology 900, a two-dimensional matrix 908 is provided, where the dimensions may be represented by X and Y coordinates. Each of a first set of switches 906 is configured to selectively couple a first terminal of each cell in a column of cells to a wireless transmitter and/or receiver circuit 902 that provide current to activate coils during wireless charging. Each of a second set of switches 904 is configured to selectively couple a second terminal of each cell in a row of cells to the wireless transmitter and/or receiver circuit 902. A cell is active when both terminals of the cell are coupled to the wireless transmitter and/or receiver circuit 902.

The use of a matrix 908 can significantly reduce the number of switching components needed to operate a network of tuned LC circuits. For example, N individually connected cells require at least N switches, whereas a two-dimensional matrix 908 having N cells can be operated with √N switches. The use of a matrix 908 can produce significant cost savings and reduce circuit and/or layout complexity. In one example, a 9-cell implementation can be implemented in a 3×3 matrix 908 using 6 switches, saving 3 switches. In another example, a 16-cell implementation can be implemented in a 4×4 matrix 908 using 8 switches, saving 8 switches.

During operation at least 2 switches are closed to actively couple one coil to a wireless transmitter and/or receiver circuit 902. Multiple switches can be closed at once in order to facilitate connection of multiple coils to the wireless transmitter and/or receiver circuit 902. Multiple switches may be closed, for example, to enable modes of operation that drive multiple transmitting coils when transferring power to a receiving device.

Figure 10:
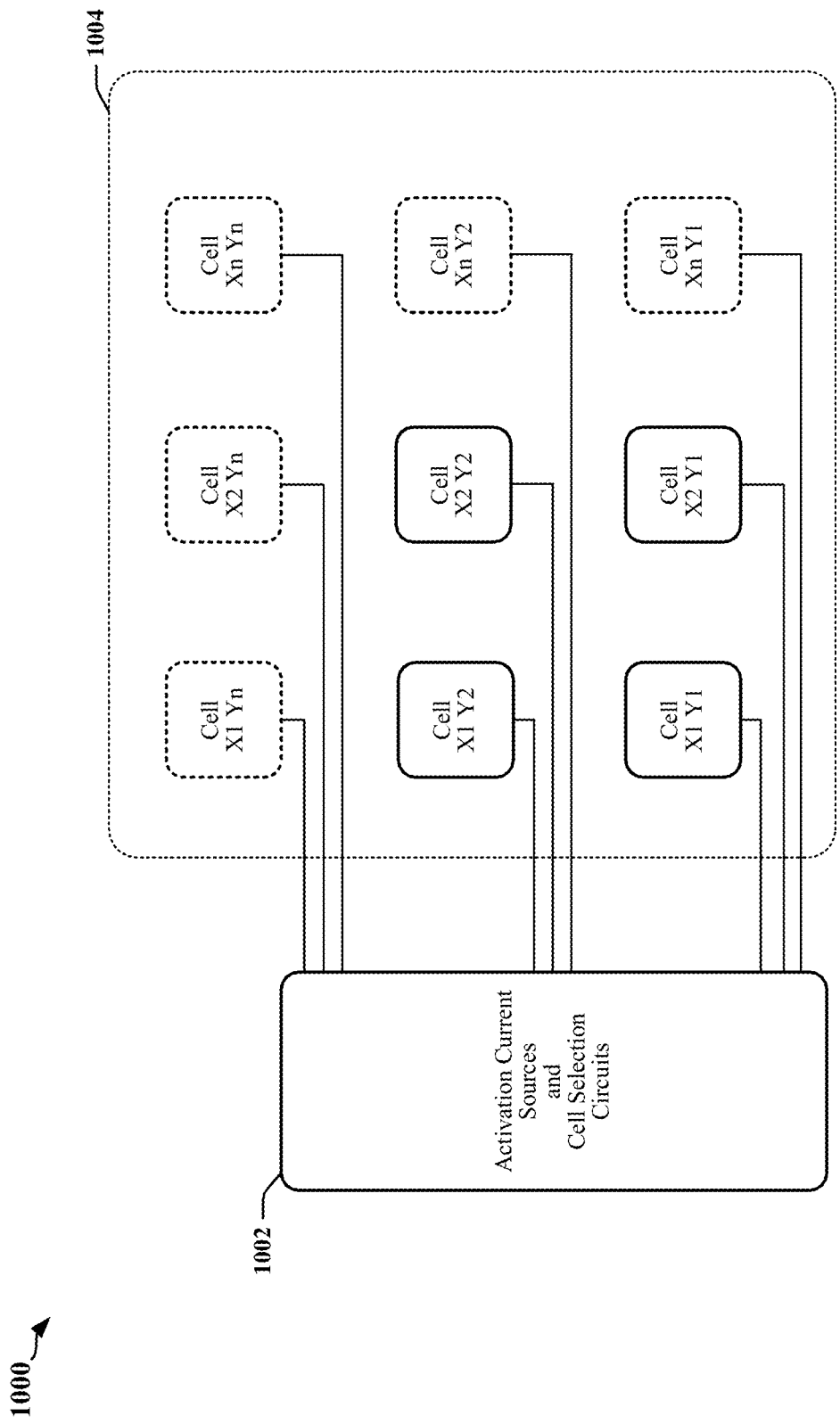
FIG. 10 illustrates a second topology that supports direct current drive in a wireless charger adapted in accordance with certain aspects disclosed herein.

FIG. 10 illustrates a second topology 1000 in which each coil or charging cell is individually and/or directly driven by a driver circuit 1002 in accordance with certain aspects disclosed herein. The driver circuit 1002 may be configured to select one or more coils or charging cells 100 from a group of coils 1004 to charge a receiving device. It will be appreciated that the concepts disclosed here in relation to charging cells 100 may be applied to selective activation of individual coils or stacks of coils. Charging cells 100 that are not in use receive no current flow. A relatively large number of charging cells 100 may be in use and a switching matrix may be employed to drive individual coils or groups of coils. In one example, a first switching matrix may configure connections that define a charging cell or a group of coils to be used during a charging event and a second switching matrix (see, e.g., FIG. 9) may be used to activate the charging cell and/or a group of selected coils.

Detecting Device Removal from a Multi-Coil Wireless Charger

Figure 11:
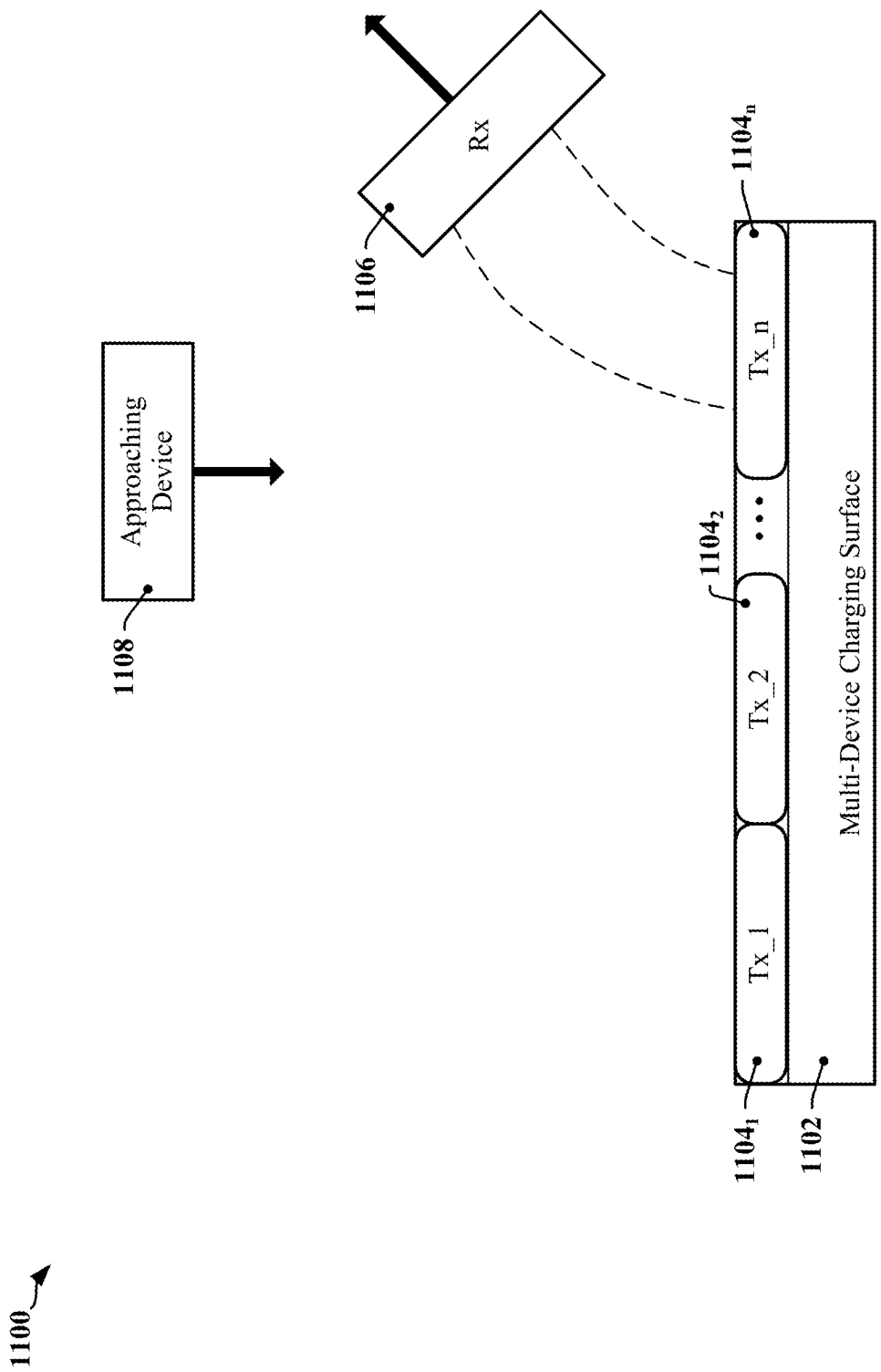
FIG. 11 illustrates a multi-coil wireless charging system configured to reliably detect removal of a receiving device in accordance with certain aspects of this disclosure.

With reference now to FIG. 11, a multi-coil wireless charging system 1100 provided in accordance with certain aspects of this disclosure can be configured to reliably detect removal of a receiving device 1106 while charging is in progress. Arbitrary and/or unanticipated removal of the receiving device can cause damage to other receiving devices 1108, in addition to potential loss of detection efficiency for an approaching device 1108. The multi-coil wireless charging system 1100 provides a charging surface 1102 that includes multiple transmitting coils $1104_1$-$1104_n$. In the illustrated example, a receiving device 1106 is removed while receiving a charging flux from the $n^{th}$ transmitting coil (transmitting coil $1104_n$).

In some instances, the charging surface 1102 continues to provide a charging current to the transmitting coil $1104_n$ after the receiving device 1106 has been removed. The approaching device 1108 may be placed on the charging surface 1102 while the charging current is flowing. The charging current is typically configured based on the capabilities of the receiving device 1106, which may differ from the capabilities of the approaching device 1108. Damage to the approaching device 1108 can occur if the approaching device 1108 is not designed to handle the level of induced current intended for the original receiving device 1106.

Certain aspects of this disclosure enable the multi-coil wireless charging system 1100 to rapidly and reliably detect the removal of the receiving device 1106 from the charging surface 1102. The multi-coil wireless charging system 1100 may discontinue the flow of the charging current to the active transmitting coil $1104_n$ upon detecting the removal of the receiving device 1106. The multi-coil wireless charging system 1100 may configure the charging surface 1102 to detect objects, including the approaching device 1108 upon detecting the removal of the receiving device 1106 and discontinuation of the charging current.

According to certain aspects of the disclosure, removal of the receiving device 1106 may be detected by monitoring charging circuits, or certain characteristics of one or more of the transmitting coils $1104_1$-$1104_n$. In certain examples, the removal of the receiving device 1106 may be detected based on changes in measured electrical quantities that can be attributed to changes in electromagnetic coupling between the transmitting coil $1104_n$ and a receiving coil in the receiving device 1106.

In one example, Dynamic Inferred Coupling Estimation (DICE) may be used to detect quality of coupling in real-time. DICE may include an evaluation of the ratio of real power to reactive power in a circuit that includes a transmitting coil and series resonant capacitor. The amount of reactive power stored in the inductor-capacitor (LC) circuit of the transmitter is substantially influenced by the coupling coefficient. The coupling coefficient defines the ratio of mutual inductance to leakage inductance in the LC circuit of the wireless transmitter. For example, leakage inductance in the LC circuit of the wireless transmitter may be expressed as:

$$Tx_{leakage} = L_{TX} \times (1-k), \quad\quad\quad\quad (\text{Eq. 3})$$

where $L_{TX}$ represents the self-inductance of the transmitter coil, and k represents the coupling coefficient. Decreasing coupling reduces coupling coefficient and increases leakage inductance, resulting in more reactive energy being stored in the leakage inductance of the transmitter. Energy stored in the leakage inductance does not contribute to power transfer and, as energy builds up in the leakage inductance, the voltage at the LC node increases.

Certain aspects of the coupling between one or more transmitting coils $1104_1$-$1104_n$ and a receiving device 1106 may be characterized by voltage measured at the LC node. Voltage measurements taken at the LC node may be available for other reasons. In some instances, voltage at the LC node may be monitored as an overvoltage indicator used to protect power electronics and the resonant capacitor. In one example, the measurement circuit includes a voltage comparator configured to detect voltages exceeding a threshold level. According to certain aspects disclosed herein, a measurement circuit may be added, or an existing measurement circuit may be used to quantify or compare a voltage at the LC node that varies directly with the quality of coupling.

Figure 12:
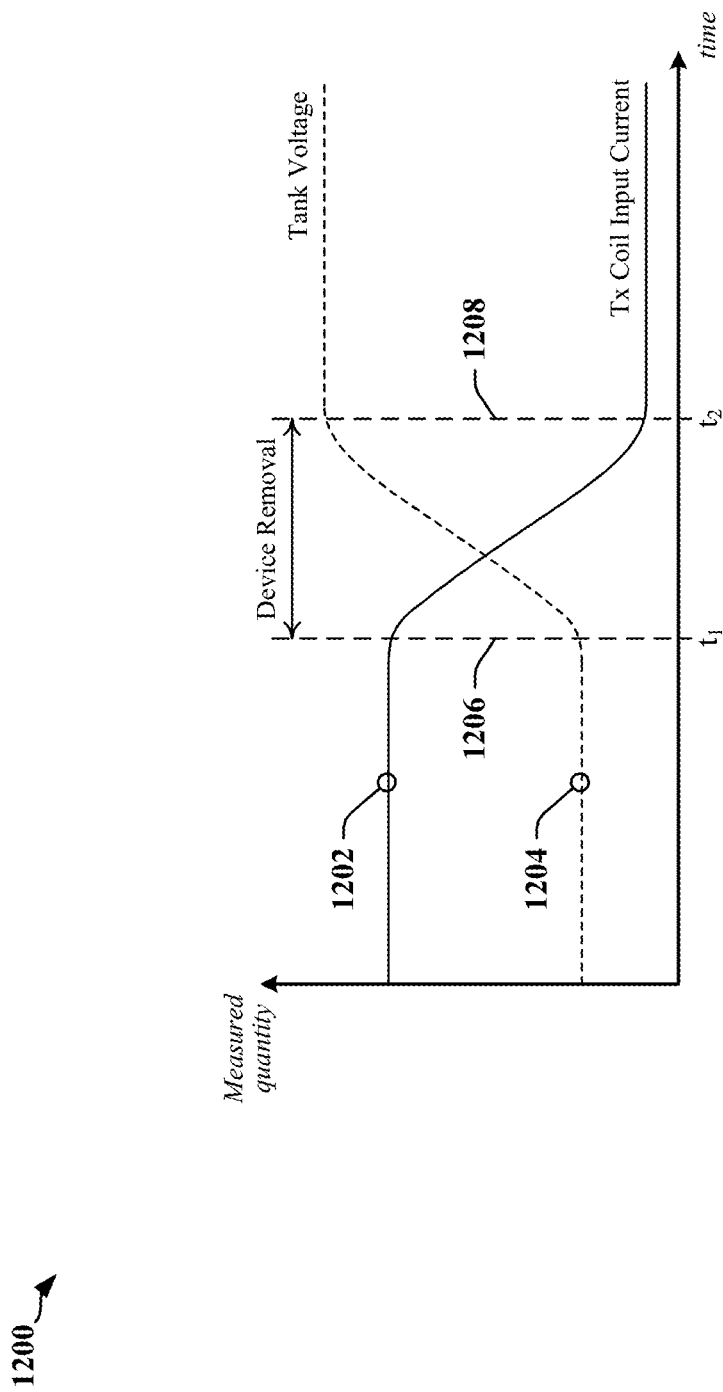
FIG. 12 is a graphical representation of certain aspects of a device removal event that may be monitored in accordance with certain aspects disclosed herein.

FIG. 12 is a graphical representation 1200 of certain aspects of a device removal event that may be monitored in accordance with certain aspects disclosed herein. Two curves 1202, 1204 represent the state of electrical quantities that are measurable in the multi-coil wireless charging system 1100.

A first curve 1202 represents the magnitude of the current flowing to one or more active transmitting coils $1104_1$-$1104_n$ to charge a receiving device 1106. The receiving device 1106 is initially placed in proximity to the charging surface 1102 and is wirelessly receiving power. The receiving device 1106 then begins to move away from the charging surface 1102, commencing at a first point in time 1206 ($t_1$), until the receiving device 1106 is receiving no power or an insignificant level of power from the active transmitting coils $1104_1$-$1104_n$ at a second point in time 1208 ($t_2$). As illustrated in FIG. 12, the charging current can be expected to drop off when the receiving device 1106 is removed. The first curve 1202 includes a step between the initial level of the charging current and the level of the charging current or quiescent current after the receiving device 1106 has been removed. A sharp drop-off in charging current may be observed, even when the receiving device 1106 is removed at moderate rate, given the inverse-square relationship associated with electromagnetic coupling when the distance between transmitter and receiver is increasing.

A second curve 1204 represents magnitude of the tank voltage measured at an LC node in a resonant circuit that includes one or more active transmitting coils $1104_1$-$1104_n$ used to wirelessly charge a receiving device 1106. The receiving device 1106 that is initially placed in proximity to the charging surface 1102 and is wirelessly receiving power begins to be move away from the charging surface 1102, commencing at the first point in time 1206 ($t_1$), and continues moving away until the receiving device 1106 is receiving no power or an insignificant power from the active transmitting coils $1104_1$-$1104_n$ at the second point in time 1208 ($t_2$). As illustrated in FIG. 12, the tank voltage can be expected to increase with the impedance of the resonant circuit that results from the receiving device 1106 being removed. The second curve 1204 includes a step between the initial level of the tank voltage and the level of the tank voltage after the receiving device 1106 has been removed. A sharp increase in impedance and tank voltage may be observed, even when the receiving device 1106 is removed at moderate rate, given the inverse-square relationship associated with electromagnetic coupling when the distance between transmitter and receiver is increasing.

In accordance with certain aspects of this disclosure, charging current provided to the one or more active transmitting coils $1104_1$-$1104_n$ and/or the tank voltage may be monitored during power transfers. The charging current may be discontinued when a step in current or voltage exceeds a threshold difference value or when the rate of change in current (di/dt) or voltage (dv/dt) exceeds a threshold rate of change. The threshold difference value and/or the threshold rate of change may be preconfigured by application, during system initialization and/or during manufacture or assembly. In some implementations the threshold difference value and/or the threshold rate of change may be dynamically configured based on a charging configuration identifying a number of transmitting coils $1104_1$-$1104_n$ to be used for wireless, charging the size of the charging current, and/or the structure or internal configuration of the receiving device 1106.

In some instances, variability in charging current or tank voltage may be observed when the receiving device 1106 is not being removed. For example, charging current or tank voltage may vary due to vibration or slippage of the receiving device 1106 or charging surface 1102, physical instability caused by motion of the multi-coil wireless charging system 1100, or due to variations in temperature or drift in power supply output. Certain implementations may employ low-pass filtering to accommodate such variability in charging current or tank voltage.

Figure 13:
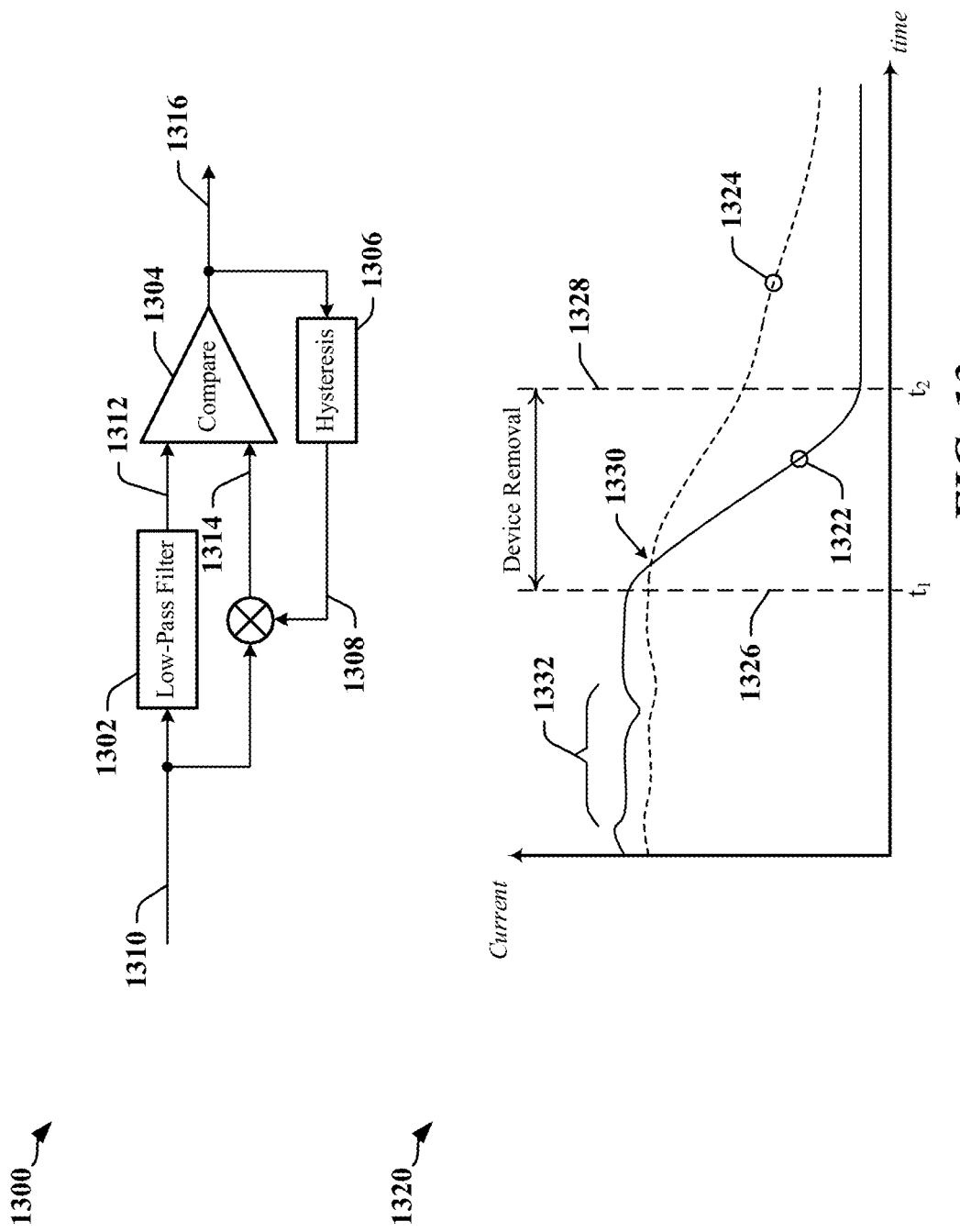
FIG. 13 illustrates a filtered threshold detection circuit that employs low-pass filtering to accommodate variability in charging current or tank voltage in accordance with certain aspects disclosed herein.

FIG. 13 illustrates a filtered threshold detection circuit 1300 that employs low-pass filtering to accommodate variability in charging current or tank voltage that is not attributable to movement of the receiving device 1106. FIG. 13 includes a graph 1320 that illustrates certain aspects related to the operation of the filtered threshold detection circuit 1300. In the illustrated example, the filtered threshold detection circuit 1300 receives an input signal 1310 representative of the charging current flowing to one or more active transmitting coils $1104_1$-$1104_n$ used to charge the receiving device 1106. The input signal 1310 is provided to a low-pass filter 1302 that can delay step changes in the input signal 1310, and/or that slows the rate of change in the input signal 1310. A comparison circuit 1304 compares the output 1312 of the low-pass filter 1302 with a threshold signal 1314 generated from the input signal 1310 using a scaling factor 1308 or offset that is based on the prior state of the output 1316 of the comparison circuit 1304. The threshold signal 1314 may be generated by a feedback circuit 1306 to provide hysteresis in the filtered threshold detection circuit 1300. The threshold signal 1314 provides a reference point 1330 that enables the comparison circuit 1304 to reliably indicate removal of the receiving device 1106. The low-pass filter 1302 may be configured with a filter constant configured such that normal small variations in current 1332 do not cause a device removal indication.

A first curve 1322 represents the magnitude of a current flowing to one or more active transmitting coils $1104_1$-$1104_n$ to charge a receiving device 1106. The receiving device 1106 is initially placed in proximity to the charging surface 1102 and is wirelessly receiving power. A second curve 1324 represents the threshold value used to determine when a step change in charging current indicates a device removal event. The receiving device 1106 begins to move away from the charging surface 1102, commencing at a first point in time 1326 ($t_1$), until the receiving device 1106 is receiving no power or an insignificant power from the active transmitting coils $1104_1$-$1104_n$, at a second point in time 1328 ($t_2$).

The charging current drops off when the receiving device 1106 is removed resulting in a step between the initial level of the charging current and the level of the charging current or quiescent current after the receiving device 1106 has been removed. The threshold signal 1314 can ensure that large step changes in the charging current (or large increases in tank voltage) is sufficient to cross the threshold value.

In another aspect of the disclosure, slot-based techniques may be used to enable detection of removal of a receiving device 1106. In one example, a time-slot is provided during which charging current is suspended a short period of time to enable one or more measurements and/or the interrogation of one or more sensors.

Figure 14:
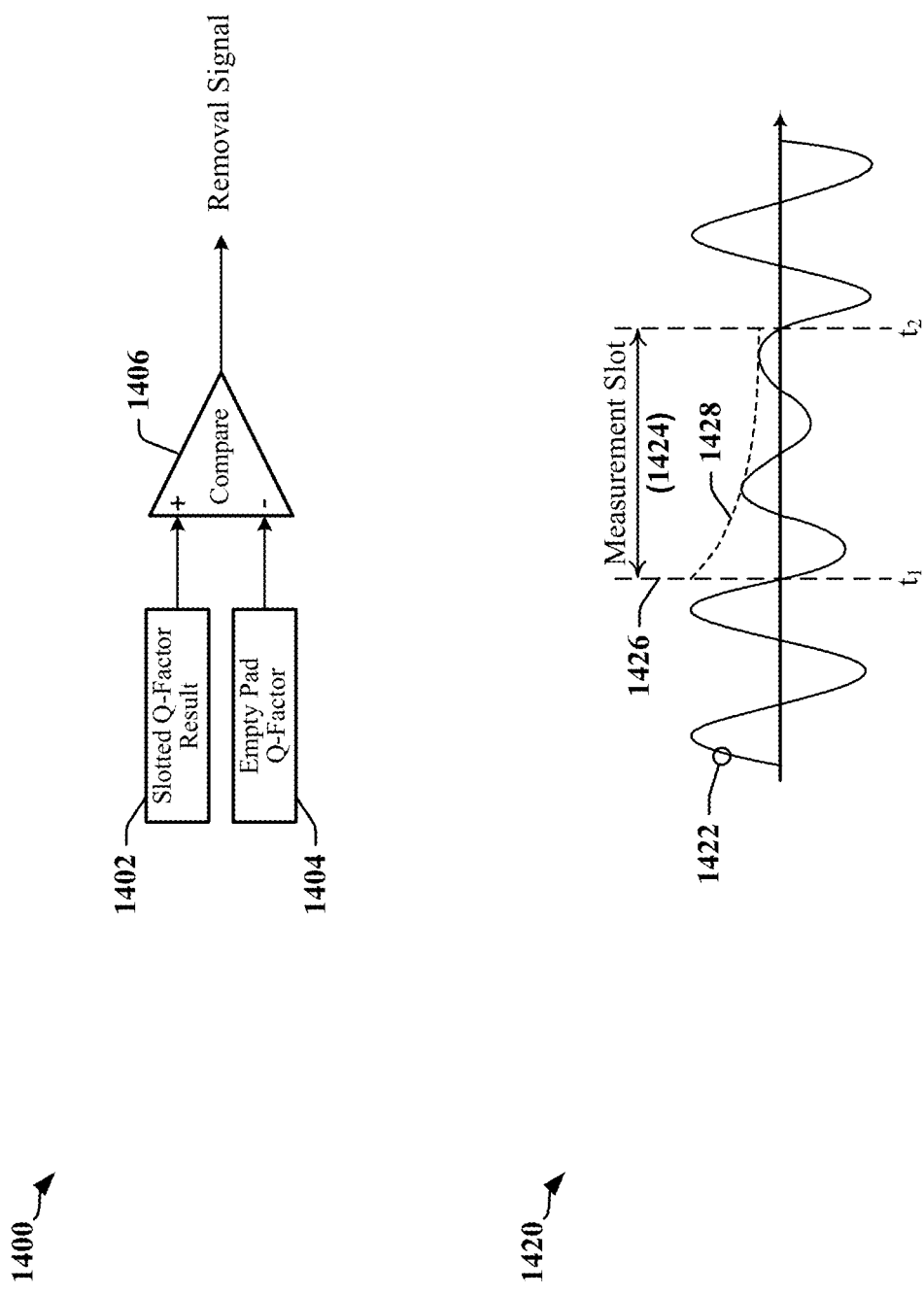
FIG. 14 illustrates a Q-factor comparison circuit used for detection of removal of a receiving device in accordance with certain aspects disclosed herein.

FIG. 14 illustrates a Q-factor comparison circuit 1400 and corresponding timing diagram 1420 that illustrate detection of removal of a receiving device 1106 during a measurement slot 1424. The timing diagram 1420 includes a curve 1422 representing magnitude of a charging current flowing in one or more active transmitting coils $1104_1$-$1104_n$ when a charging surface 1102 of a multi-coil wireless charging system 1100 is configured to charge a receiving device 1106. The measurement slot 1424 may be provided periodically or in response to detection of a step change in the magnitude of the charging current or tank voltage. A slotted Q-factor test may be performed during the measurement slot 1424. The measurement slot 1424 may be provided when the multi-coil wireless charging system 1100 suspends or terminates the charging current. In one example, the measurement slot 1424 has a duration of up to 100 microseconds (μs). Energy stored in the resonant circuit decays at rate that is determined in part by the Q-factor of the resonant circuit. The Q-factor of the resonant circuit may be used as a measure of the electromagnetic coupling between certain active transmitting coils $1104_1$-$1104_n$ in the charging surface 1102 and the receiving coil in the receiving device 1106.

A slotted Q-factor test may commence at a first point in time 1426 ($t_1$), when the multi-coil wireless charging system 1100 ceases to power the resonant circuit that includes the active transmitting coils $1104_1$-$1104_n$. The magnitude of the current in the resonant circuit decays 1428 at a rate determined by the Q-factor of the resonant circuit. In one example, a Q-factor 1402 may be calculated and compared to a reference Q-factor 1404 using a comparator 1406. The reference Q-factor 1404 may correspond to a Q-factor calculated when no receiving device is electromagnetically coupled to the active transmitting coils $1104_1$-$1104_n$.

In some implementations, the filtered threshold detection circuit 1300 may be used to compare calculated Q-factor with a threshold Q-factor. In some implementations, a measurement slot 1424 is provided periodically to enable the slotted Q-factor test to be used to detect presence of foreign objects as well as device removal events.

Another aspect of this disclosure relates to detecting the removal of a receiving device 1106 using threshold values and other parameters that are maintained in lookup tables. For example, lookup tables may be used to maintain measured values of charging current, tank voltage, Q-factor and other characteristics of a multi-coil wireless charging system 1100. In some implementations, the lookup tables may maintain threshold values and other parameters for different charging configurations. Each charging configuration may define a set of transmitting coils $1104_1$-$1104_n$ to be used for charging the receiving device 1106 and a current distribution among the transmitting coils $1104_1$-$1104_n$. For example, one or more charging configurations may define phase offsets for currents provided to different transmitting coils $1104_1$-$1104_n$ when an electromagnetic flux is to be concentrated at a specific location or directed within an area spanned by the transmitting coils $1104_1$-$1104_n$. One or more charging configurations may be provided to match the capabilities, location, orientation, charging state, and/or another characteristic of the receiving device 1106. The use of lookup tables can improve the efficiency of detection circuits and processes used to determine when a receiving device 1106 has been removed.

Figure 15:
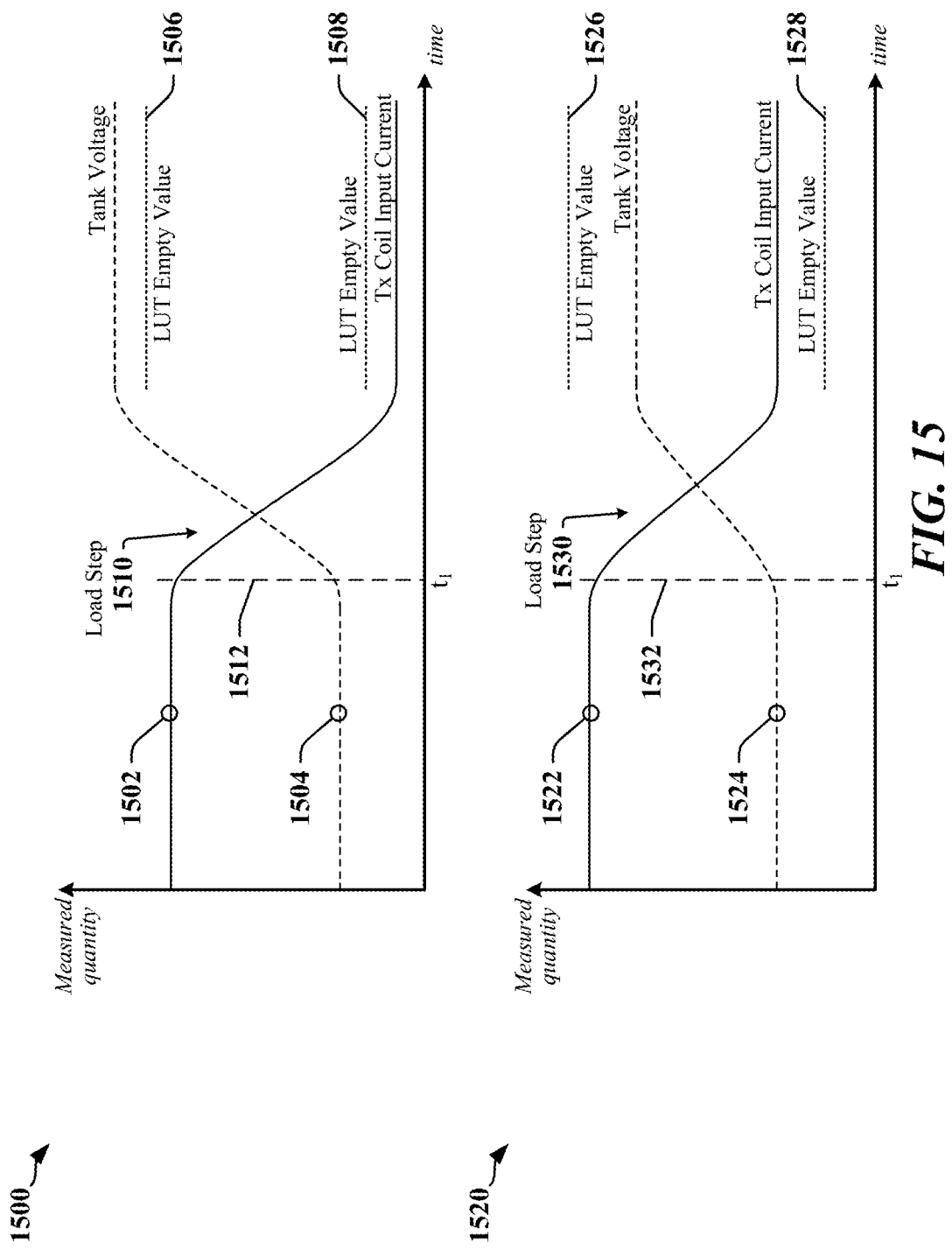
FIG. 15 illustrates the use of look-up tables for detecting a device removal event in accordance with certain aspects disclosed herein.

FIG. 15 includes graphs 1500, 1520 illustrating the use of look-up tables for detecting a device removal event that may be monitored in accordance with certain aspects disclosed herein. In one example, a lookup table (LUT) may maintain information identifying a known quiescent or "empty" power and/or a known current draw for a charging configuration. The multi-coil wireless charging system 1100 may compare measured power, voltage and/or current after a step event has been detected with a threshold value or other corresponding value for quiescent power, voltage and/or current draw maintained in a lookup table. The comparison may indicate whether the step event corresponds to a load change or a device removal. A load change may occur when a receiving device dumps its load. The lookup table may include values for quiescent power, voltage and/or current measured for one or more transmitting coils $1104_1$-$1104_n$ that are not electromagnetically coupled to a receiving coil or another object that may affect the resonant frequency or Q-factor of the resonant circuit that includes the more transmitting coils $1104_1$-$1104_n$. In some implementations, the lookup table may be populated with values measured for different charging configurations. In some implementations, the lookup table may be populated during a system configuration or calibration procedure.

The first graph 1500 illustrates an example in which the thresholds 1506, 1508 identified in a lookup table can reliably indicate that the receiving device 1106 has been removed. The second graph 1520 illustrates an example in which the thresholds 1526, 1528 maintained in a lookup table can reliably indicate that a load change has occurred. A first curve 1502, 1522 represents the magnitude of the current flowing to one or more active transmitting coils $1104_1$-$1104_n$ to charge a receiving device 1106. The receiving device 1106 is initially placed in proximity to the charging surface 1102 and is wirelessly receiving power. The receiving device 1106 then begins to move away from the charging surface 1102, commencing at a first point in time 1512, 1532 ($t_1$), until the receiving device 1106 is receiving reduced power, corresponding to a drop-off in the charging current. Each of the first curves 1502, 1522 includes a step 1510, 1530 between the initial level of the charging current and the level of the charging current after the receiving device 1106 has been removed.

In one aspect of the disclosure, the magnitude of the charging current measured after the step 1510, 1530 is compared to a current threshold 1508, 1528 (or reference quiescent current level) obtained from a lookup table. In one example, the multi-coil wireless charging system 1100 may terminate the charging current based on the difference between the charging current level after the step 1510, 1530 and a reference quiescent current level or current threshold 1508, 1528. In the example illustrated by the first graph 1500, the multi-coil wireless charging system 1100 may terminate the charging current when the charging current level is within a configured range that includes a reference quiescent current level or is less than a current threshold 1508, 1528 calculated using the reference quiescent current level. In the example illustrated by the second graph 1520, the multi-coil wireless charging system 1100 may continue to provide the charging current when the charging current level is greater than the current threshold 1508, 1528 by an amount that indicates a load change event has occurred.

A second curve 1504, 1524 in the graphs 1500, 1520 represents the magnitude of the tank voltage measured across a resonant circuit that includes to one or more active transmitting coils $1104_1$-$1104_n$. The receiving device 1106 is initially placed in proximity to the charging surface 1102 and is wirelessly receiving power. The receiving device 1106 then begins to move away from the charging surface 1102, commencing at a first point in time 1512, 1532 ($t_1$), until the receiving device 1106 is receiving reduced power, corresponding to an increase in the tank voltage. Each of the second curves 1504, 1524 includes a step 1510, 1530 between the initial level of the tank voltage and the level of the tank voltage after the receiving device 1106 has been removed.

In one aspect of the disclosure, the magnitude of the tank voltage measured after the step 1510, 1530 is compared to a reference quiescent tank voltage or a voltage threshold 1506, 1526 obtained from a lookup table. The multi-coil wireless charging system 1100 may terminate the charging current based on the difference between the tank voltage level after the step 1510, 1530 and the reference quiescent tank voltage or the voltage threshold 1506, 1526. In the example illustrated by the first graph 1500, the multi-coil wireless charging system 1100 may terminate the charging current when the tank voltage level is within a configured range that includes the quiescent tank voltage or is greater than the voltage threshold 1506, 1526. In the example illustrated by the second graph 1520, the multi-coil wireless charging system 1100 may continue to provide the charging current when the tank voltage is less than the voltage threshold 1506, 1526 indicating that a load change event has occurred.

Figure 16:
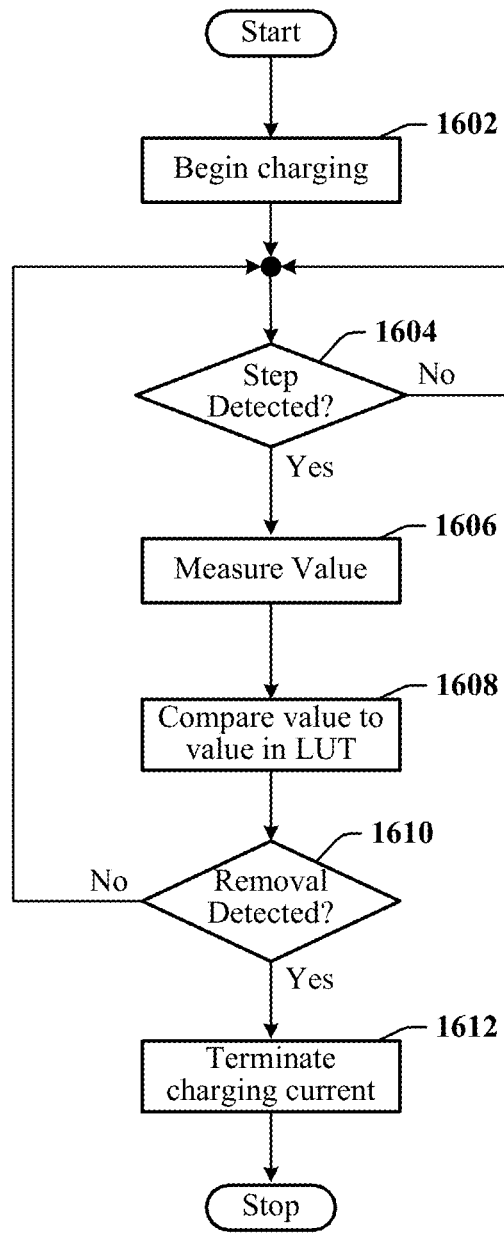
FIG. 16 illustrates an example of a procedure that uses look-up tables when detecting a device removal event in accordance with certain aspects disclosed herein.

FIG. 16 is a flowchart 1600 that illustrates an example of a procedure based on the examples illustrated in FIG. 15. The procedure may be performed at a multi-coil wireless charging system 1100. At block 1602, the multi-coil wireless charging system 1100 may begin providing a charging current to a receiving device 1106 in accordance with a charging configuration. The multi-coil wireless charging system 1100 may continue charging until at block 1604, the multi-coil wireless charging system 1100 detects a step change in a measured value. In one example, the measured value may represent the magnitude of the charging current. In another example, the measured value may represent a tank voltage. At block 1606, the multi-coil wireless charging system 1100 may measure the value after the step. At block 1608, the multi-coil wireless charging system 1100 may compare the measured value to a threshold stored in a lookup table. The threshold may be calculated from an idle or quiescent value. The relationship between the measured value and the threshold may indicate whether the step change in the measured value is the result of removal of the receiving device 1106. When the multi-coil wireless charging system 1100 determines at block 1610 that the step change relates to a device removal event, then at block 1612, the multi-coil wireless charging system 1100 may terminate the charging current. If the multi-coil wireless charging system 1100 determines at block 1610 that the step change does not relate a device removal event, then the process may continue at block 1604.

Figure 17:
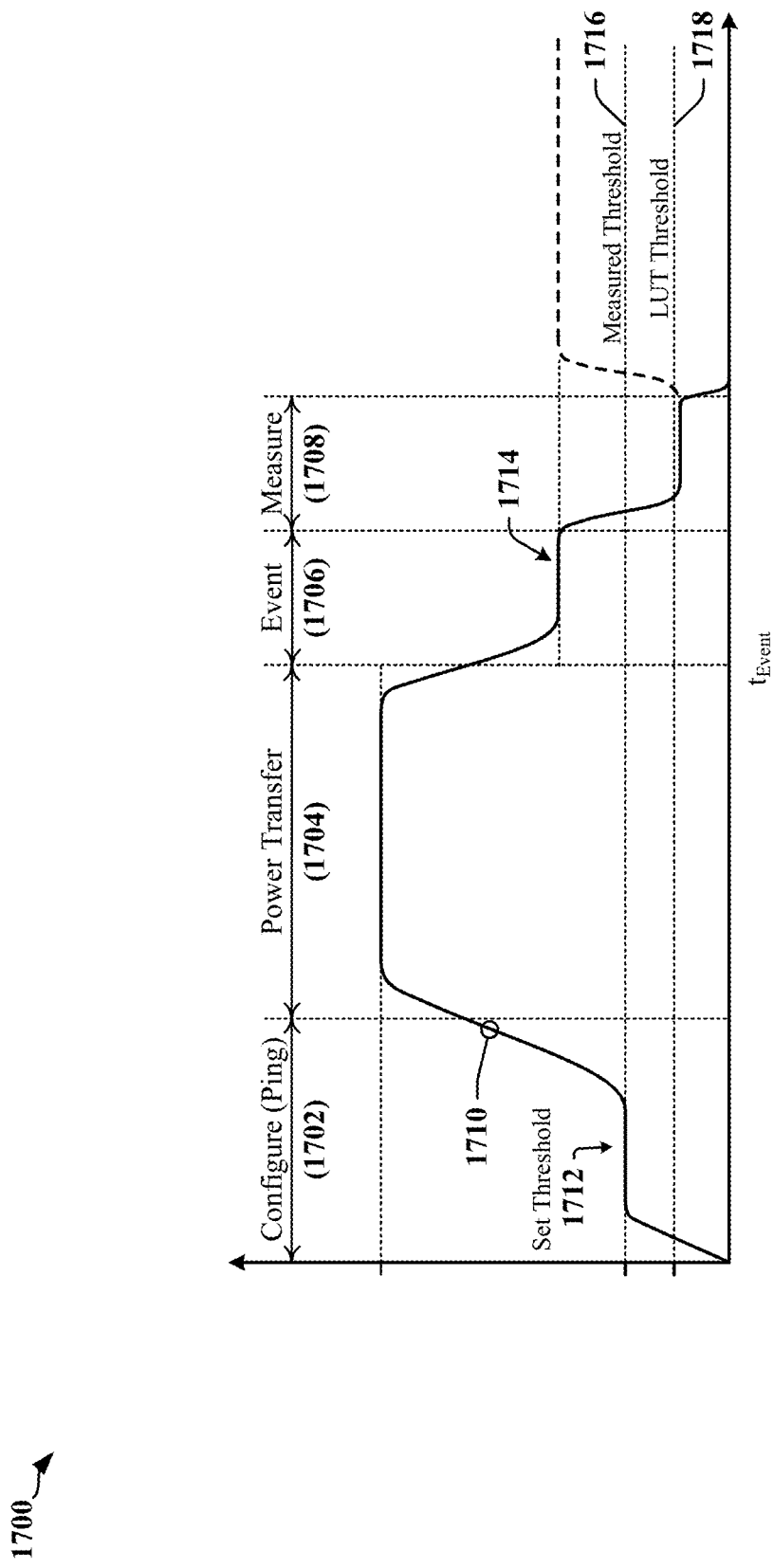
FIG. 17 illustrates the use of measured quiescent or idle transfer power draw for detecting a device removal event in accordance with certain aspects disclosed herein.

FIG. 17 is a graph 1700 that illustrates the use of measured quiescent power draw or a preconfigured, or premeasured idle transfer power draw value maintained in a look-up table for detecting a device removal event in accordance with certain aspects disclosed herein. In one aspect, a measurement of power transfer is obtained during an initial configuration interval period 1702 that may be associated with a ping procedure. The curve 1710 represents power or current transfer from the multi-coil wireless charging system 1100 to the receiving device 1106. In one example, a measured power transfer value that characterizes a minimal or quiescent power transfer state may be used to set a known operating point for the multi-coil wireless charging system 1100. The known operating point may be used to define a threshold for detecting device removal. The latter threshold may be referred to as the Measured Threshold 1716 herein. In another aspect, a threshold for detecting device removal may be obtained from a lookup table. The latter threshold may be referred to as the LUT Threshold 1718 herein. The LUT Threshold 1718 may be calculated or measured during system initialization, assembly or during a calibration procedure. In one example, the LUT Threshold 1718 may be calculated or measured when no chargeable device or other object is located on or near the charging surface 1102.

The curve 1710 may correspond to a charging current that enables power to be transferred from the multi-coil wireless charging system 1100 to the receiving device 1106. After initial detection and/or configuration of the receiving device 1106, a minimal power transfer level 1712 may be determined and/or used to set the Measured Threshold 1716. A power transfer period 1704 ensues. The power transfer period 1704 continues until an event 1706 is detected, where the level of power transfer exhibits a step drop. In the illustrated example, the level of power transfer drops to a lower level 1714 that may be above or below the threshold used to determine device removal. The threshold may be selected from Measured Threshold 1716 or LUT Threshold 1718. The multi-coil wireless charging system 1100 may initiate a measurement slot 1708 in order to establish or confirm a device removal has occurred. During the measurement slot 1708, the multi-coil wireless charging system 1100 may measure and compare quiescent power draw to the selected threshold. The multi-coil wireless charging system 1100 may discontinue the charging current after determining that the receiving device 1106 has been removed. The multi-coil wireless charging system 1100 may continue the power transfer at the lower level 1714 after determining that the receiving device 1106 has not been removed.

Figure 18:
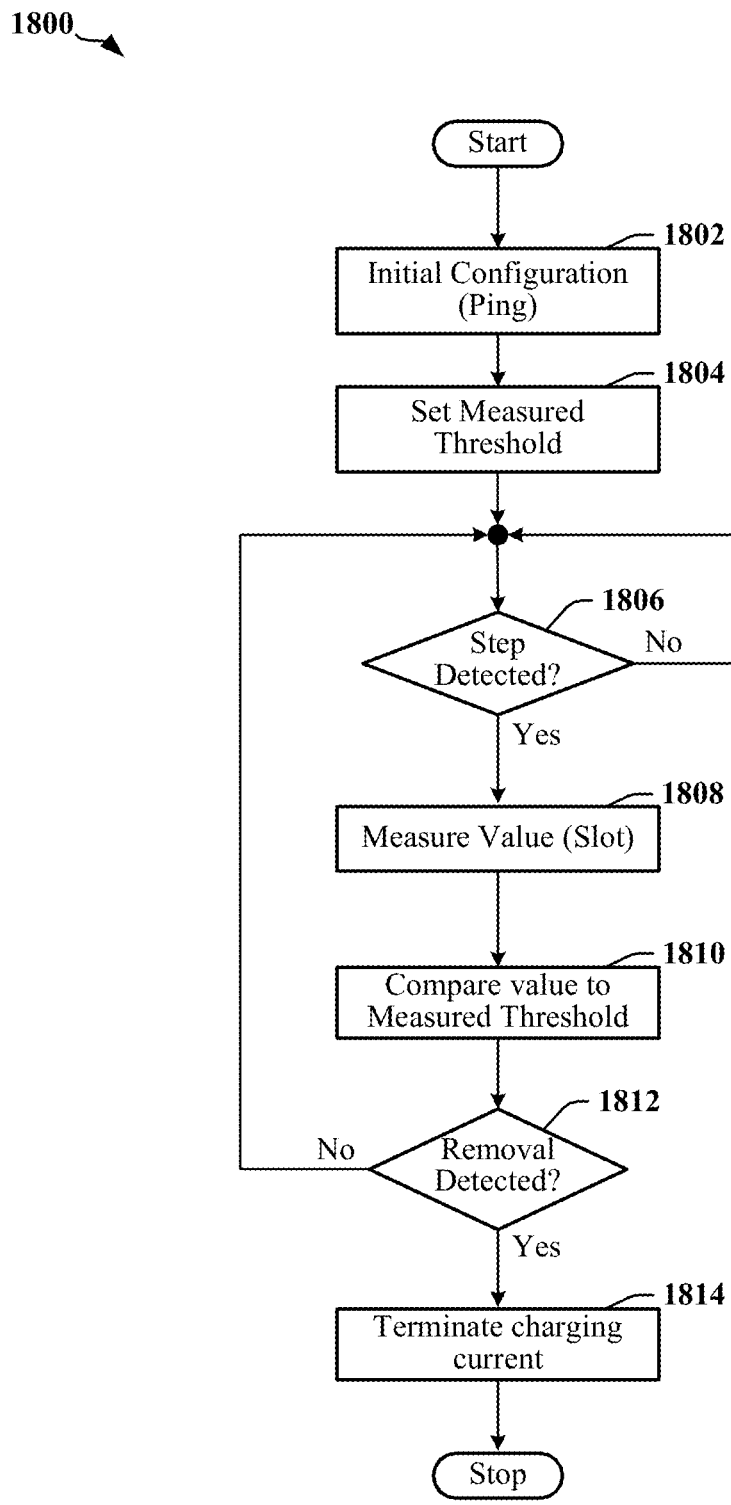
FIG. 18 illustrates a first example of a procedure for device removal detection based on measured quiescent power draw according to certain aspects disclosed herein.

FIG. 18 is a flowchart 1800 that illustrates a first example of a procedure for device removal detection based on measured quiescent power draw. The procedure may be performed at a multi-coil wireless charging system 1100. At block 1802, the multi-coil wireless charging system 1100 may detect the presence of a receiving device 1106 that has been placed on or near the charging surface 1102. During an initial configuration interval period 1702, the multi-coil wireless charging system 1100 may interrogate and/or negotiate with the receiving device 1106 to generate a charging configuration. At block 1804, the multi-coil wireless charging system 1100 may provide a quiescent current to one or more active transmitting coils $1104_1$-$1104_n$, and may measure quiescent power draw. The multi-coil wireless charging system 1100 may use the measured quiescent power draw to establish a Measured Threshold 1716. In one example, the Measured Threshold 1716 may be stored in non-volatile memory such as random-access memory (RAM) or register-based memory.

The power transfer period 1704 begins, during which the multi-coil wireless charging system 1100 may provide a charging current to the active transmitting coils $1104_1$-$1104_n$ to enable power transfer to a receiving device 1106 in accordance with the charging configuration. The multi-coil wireless charging system 1100 may continue charging until at block 1806, the multi-coil wireless charging system 1100 detects a step change in a measured power draw. In one example, the measured power draw may be represented by the magnitude of the charging current. In another example, the measured power draw may be represented by a tank voltage. At block 1808, the multi-coil wireless charging system 1100 may provide a measurement slot 1708 during which the charging current is reduced to quiescent levels. The multi-coil wireless charging system 1100 may measure the quiescent power draw during the measurement slot 1708. At block 1810, the multi-coil wireless charging system 1100 may compare the measured quiescent power draw to the Measured Threshold 1716. The relationship between the measured quiescent power draw and the Measured Threshold 1716 may indicate whether the step change in the power draw is the result of removal of the receiving device 1106. When the multi-coil wireless charging system 1100 determines at block 1812 that the step change relates to a device removal event, then at block 1814, the multi-coil wireless charging system 1100 may terminate the charging current. If the multi-coil wireless charging system 1100 determines at block 1812 that the step change does not relate a device removal event, then the process may continue at block 1806.

Figure 19:
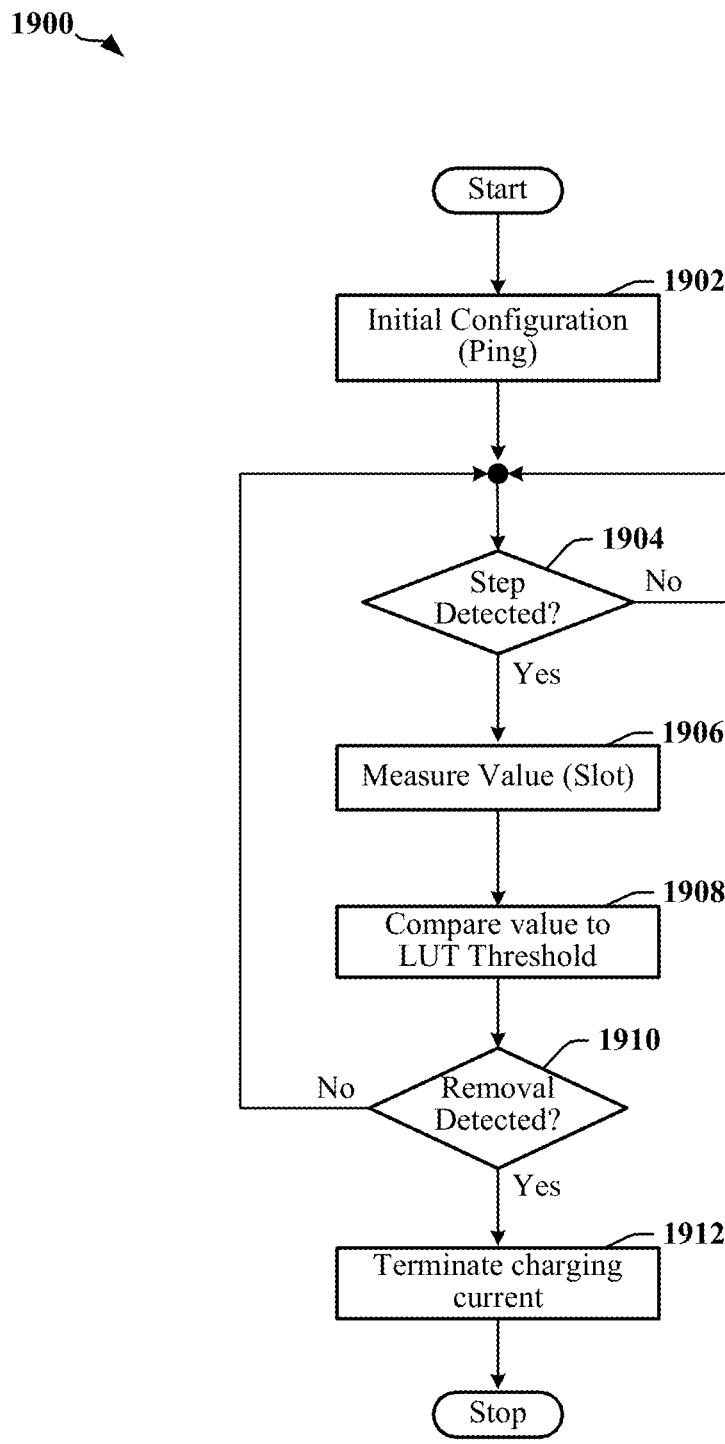
FIG. 19 illustrates a second example of a procedure for device removal detection based on measured quiescent power draw according to certain aspects disclosed herein.

FIG. 19 is a flowchart 1900 that illustrates a second example of a procedure for device removal detection based on measured quiescent power draw. The procedure may be performed at a multi-coil wireless charging system 1100. At block 1902, the multi-coil wireless charging system 1100 may detect the presence of a receiving device 1106 that has been placed on or near the charging surface 1102. During an initial configuration interval period 1702, the multi-coil wireless charging system 1100 may interrogate and/or negotiate with the receiving device 1106 to generate a charging configuration.

The power transfer period 1704 begins, during which the multi-coil wireless charging system 1100 may provide a charging current to one or more active transmitting coils $1104_1$-$1104_n$ configured to wirelessly transfer power to a receiving device 1106 in accordance with the charging configuration. The multi-coil wireless charging system 1100 may continue charging until at block 1904, the multi-coil wireless charging system 1100 detects a step change in a measured power draw. In one example, the measured power draw may be represented by the magnitude of the charging current. In another example, the measured power draw may be represented by a tank voltage. At block 1906, the multi-coil wireless charging system 1100 may provide a measurement slot 1708 during which the charging current is reduced to quiescent levels. The multi-coil wireless charging system 1100 may measure the quiescent power draw during the measurement slot 1708. At block 1908, the multi-coil wireless charging system 1100 may compare the measured quiescent power draw to an LUT Threshold 1718. The LUT Threshold 1718 may be premeasured or precalculated based on a quiescent (empty-coil) power draw. The premeasured or precalculated power draw may be maintained in a lookup table stored in non-volatile memory, such as flash memory. The relationship between the measured quiescent power draw to the LUT Threshold 1718 may indicate whether the step change in the power draw is the result of removal of the receiving device 1106. When the multi-coil wireless charging system 1100 determines at block 1910 that the step change relates to a device removal event, then at block 1912, the multi-coil wireless charging system 1100 may terminate the charging current. If the multi-coil wireless charging system 1100 determines at block 1910 that the step change does not relate a device removal event, then the process may continue at block 1904.

Figure 20:
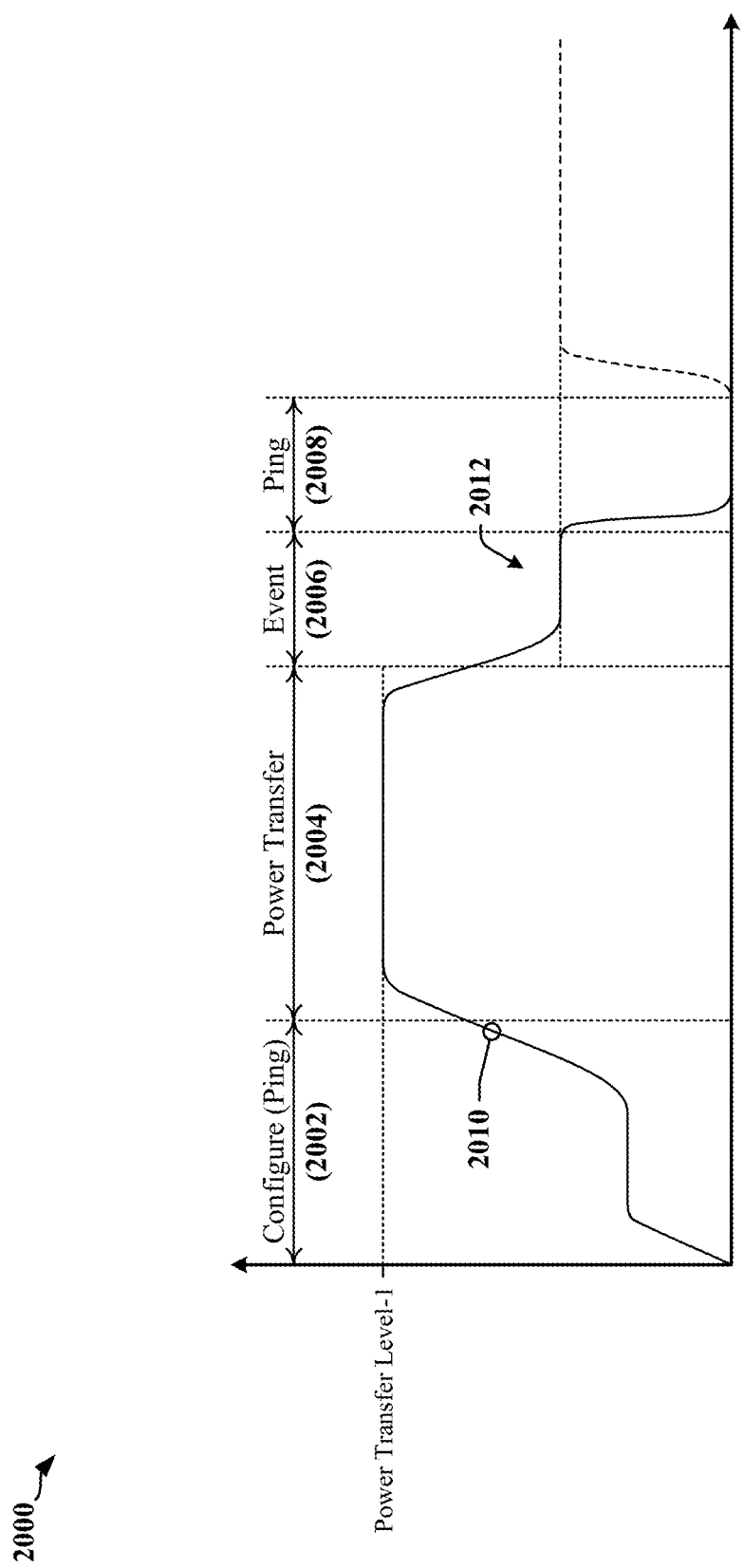
FIG. 20 illustrates a first example of the use of a measurement slot to perform a ping procedure according to certain aspects disclosed herein.

FIG. 20 is a graph 2000 that illustrates the use of a measurement slot to perform a ping procedure that can determine whether the receiving device 1106 remains on or near the charging surface 1102. The ping procedure may include an active and/or passive ping. The ping procedure may include an analog and/or digital ping. An initial configuration interval period 2002 may be provided after a device or object has been detected on or near the charging surface 1102. A ping procedure may be conducted within the initial configuration interval period 2002 to determine whether the detected object is a chargeable object and to determine a charging configuration suitable for a chargeable object.

The curve 2010 represents power transfer from the multi-coil wireless charging system 1100 to the receiving device 1106. During a power transfer period 2004, an event 2006 may be detected, where the level of power transfer exhibits a step drop. The multi-coil wireless charging system 1100 may initiate a measurement slot 2008 in order to establish or confirm a device removal event. During the measurement slot 2008, the multi-coil wireless charging system 1100 may terminate the charging current to permit a ping procedure to be used to determine whether the receiving device 1106 has been removed. The multi-coil wireless charging system 1100 may discontinue the charging current after determining that the receiving device 1106 has been removed. The multi-coil wireless charging system 1100 may continue power transfer at a lower level 2012 after determining that the receiving device 1106 has not been removed.

Figure 21:
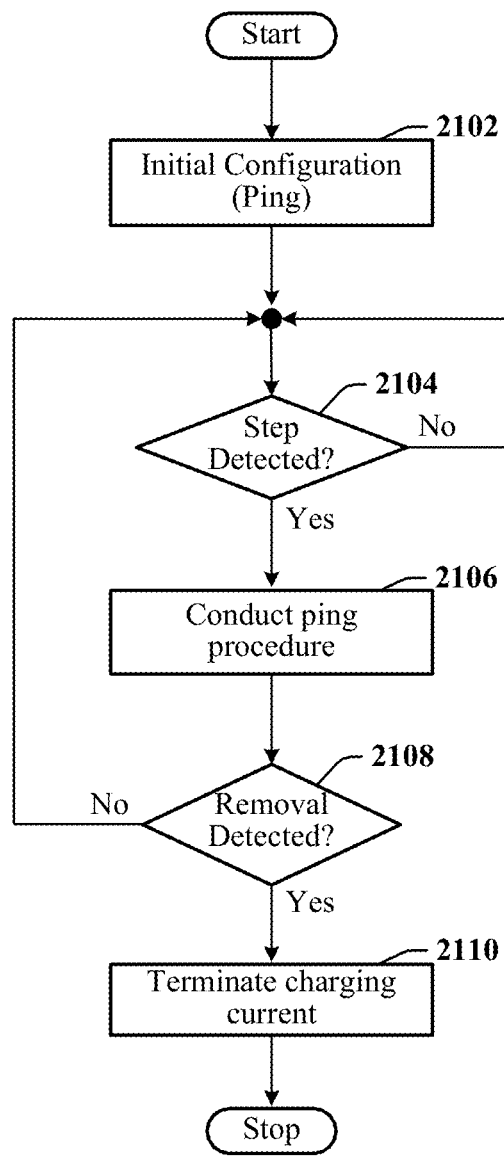
FIG. 21 illustrates a second example of the use of a measurement slot to perform a ping procedure according to certain aspects disclosed herein.

FIG. 21 is a flowchart 2100 that illustrates an example of a method for device removal detection based on a ping procedure performed during a measurement slot. The method may be performed at a multi-coil wireless charging system 1100. At block 2102, the multi-coil wireless charging system 1100 may detect the presence of a receiving device 1106 that has been placed on or near the charging surface 1102. During an initial configuration interval period 2002, the multi-coil wireless charging system 1100 may interrogate and/or negotiate with the receiving device 1106 to generate a charging configuration.

The power transfer period 2004 begins, during which the multi-coil wireless charging system 1100 may provide a charging current to one or more active transmitting coils $1104_1$-$1104_n$ configured to wirelessly transfer power to a receiving device 1106 in accordance with the charging configuration. The multi-coil wireless charging system 1100 may continue charging until at block 2104, the multi-coil wireless charging system 1100 detects a step change in a measured power draw, current or tank voltage. At block 2106, the multi-coil wireless charging system 1100 may provide a measurement slot 2008 during which one or more ping procedures may be executed to determine whether the step change is the result of removal of the receiving device 1106. When the multi-coil wireless charging system 1100 determines at block 2108 that the step change relates to a device removal event, then at block 2110, the multi-coil wireless charging system 1100 may terminate the charging current. If the multi-coil wireless charging system 1100 determines at block 2108 that the step change does not relate a device removal event, then the process may continue at block 2104.

Device Removal Detection Using Sensors

According to certain aspects of this disclosure, presence, position and/or orientation of a receiving device may be determined using a location sensing technique that involves, for example, detecting differences or changes in capacitance, resistance, inductance, touch, pressure, temperature, load, strain, and/or another appropriate type of sensing. Location sensing may be employed to determine presence or location of an object or device to be charged. Location sensing may also be employed to detect removal of a receiving device during power transfer from a charging surface.

Figure 22:
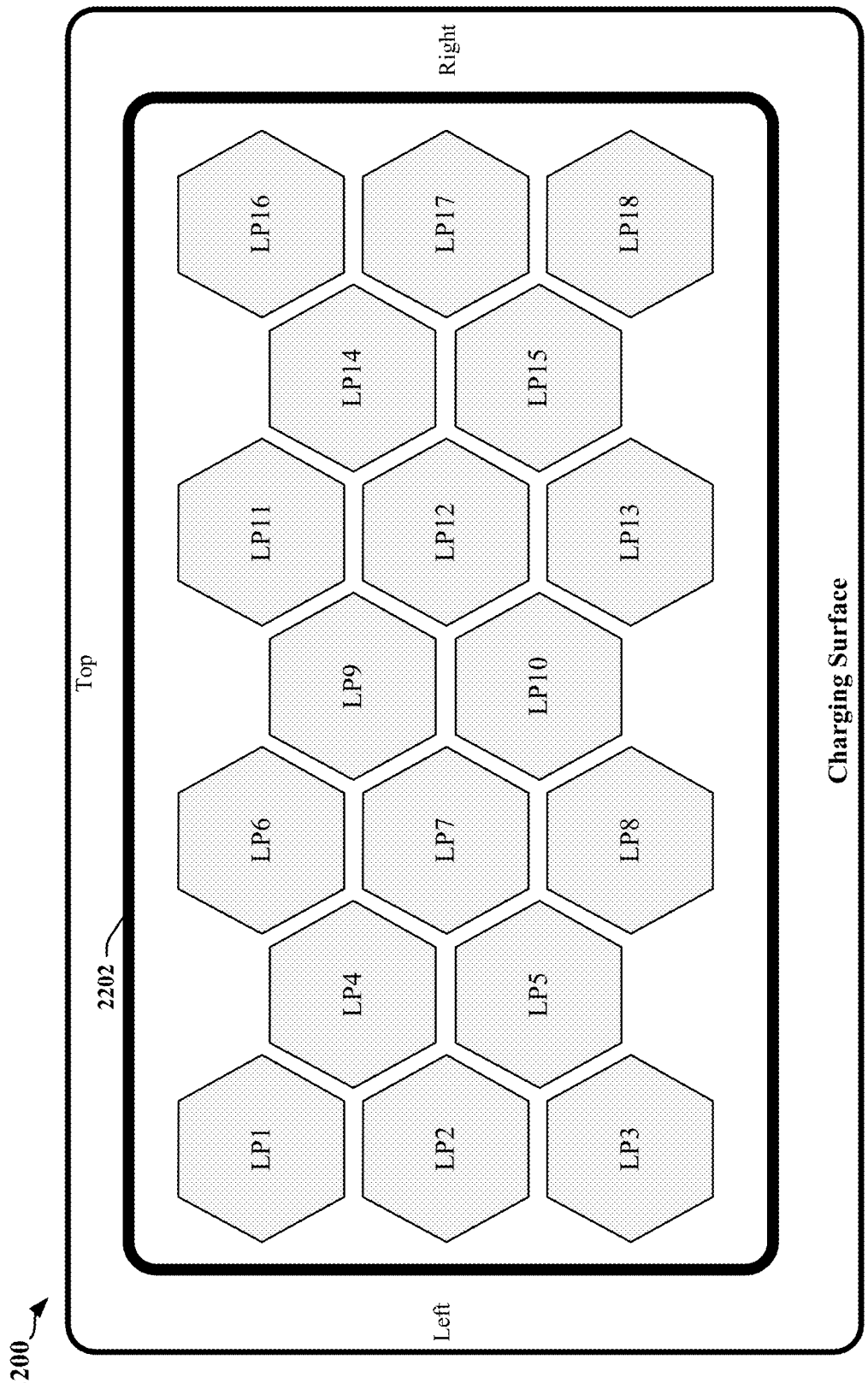
FIG. 22 illustrates a first example of the use of sensors to detect removal of a receiving device during power transfer in accordance with certain aspects disclosed herein.

FIG. 22 illustrates a first example of a charging surface 2200 of a wireless charger that includes one or more sensors 2202 that can detect removal of a receiving device during power transfer from the charging surface 2200. In this example, the sensors 2202 may include capacitive, inductive, or hall effect sense elements configured to detect the presence of a device. In some implementations, the sense elements may border the charging coils (LP1-LP18) provided in the charging surface 2200. In some implementations, the sense elements may border individual charging coils or groups of charging coils. In certain implementations, charging zones may be identified on the charging surface 2200, and the sense elements may define or monitor the outer limits of each charging zone.

The sensors 2202 may also be used to detect changes indicative of removal of a receiving device from the charging surface 2200. In some implementations, the sensors 2202 may support or enhance removal detection techniques based on measurements of charging current, tank voltages and/or power draw. The use of sensors 2202 may improve reliability, efficiency and can reduce power consumption and processor loading.

Figure 23:
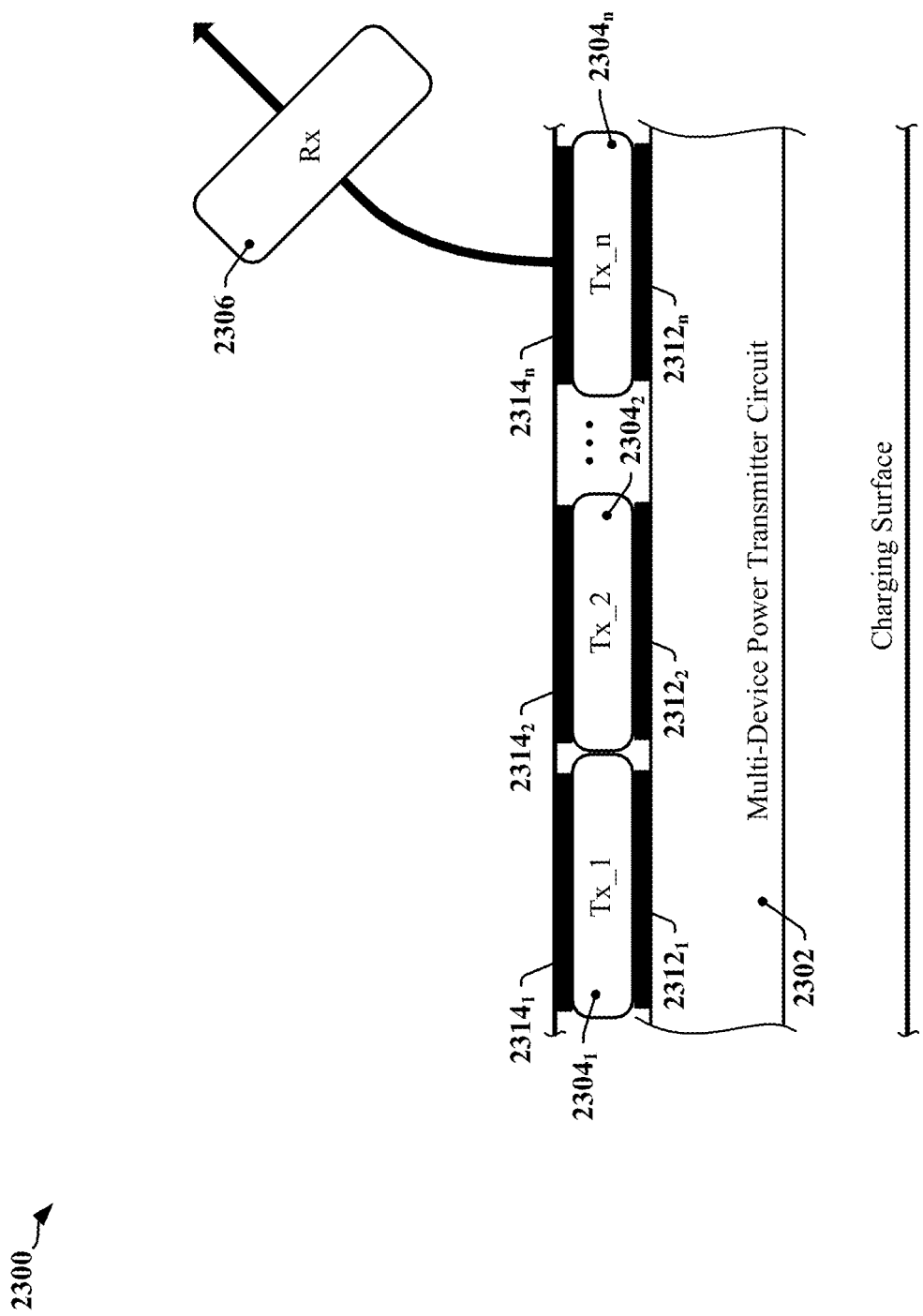
FIG. 23 illustrates a second example of the use of sensors to detect removal of a receiving device during power transfer in accordance with certain aspects disclosed herein.

FIG. 23 illustrates a second example of a charging surface 2300 of a wireless charger that includes one or more sensors $2312_1$-$2312_n$ and/or $2314_1$-$2314_n$ that can be used for detecting device removal. The sensors $2312_1$-$2312_n$ and/or $2314_1$-$2314_n$ can measure deformation, loading and/or weight attributable to a device or object placed on or near the charging surface 2300. The sensors $2312_1$-$2312_n$ and/or $2314_1$-$2314_n$ may be configured to measure deformation as mechanical strain which may quantify the displacement between two points on a surface. In one example, sensors $2312_1$-$2312_n$ placed between transmitter coils $2304_1$-$2304_n$ and a circuit board 2302 may provide measurements that correspond to the combined weight of the transmitter coils $2304_1$-$2304_n$ and the device or object placed on or near the charging surface 2300. The weight of the device or object may be calculated from the combined weight, or a change in the combined weight may be used to indicate placement or removal of the device or object. In another example, sensors $2314_1$-$2314_n$ placed on the exterior surface of the charging surface 2300 and above the transmitter coils $2304_1$-$2304_n$ may provide measurements that correspond to the deformation of the exterior surface caused by the weight and shape of the object placed on or near the charging surface 2300.

The sensors $2312_1$-$2312_n$ and/or $2314_1$-$2314_n$ may be used to detect changes indicative of removal of a receiving device 2306 from the charging surface 2300. In some implementations, the sensors $2312_1$-$2312_n$ and/or $2314_1$-$2314_n$ may support or enhance removal detection techniques based on measurements of charging current, tank voltages and/or power draw. The use of sensors $2312_1$-$2312_n$ and/or $2314_1$-$2314_n$ may improve reliability, efficiency and can reduce power consumption and processor loading.

Figure 24:
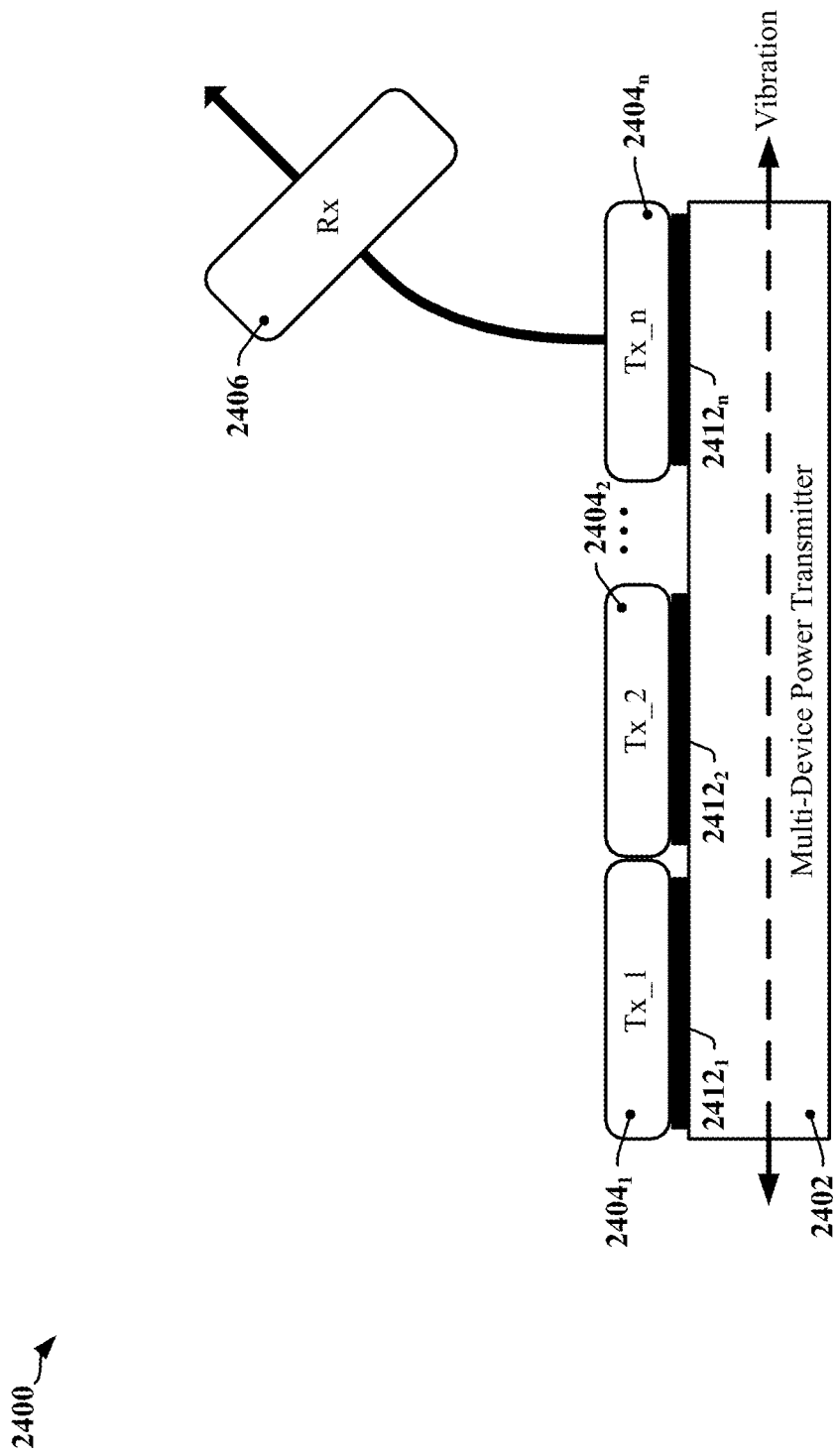
FIG. 24 illustrates a third example of the use of sensors to detect removal of a receiving device during power transfer in accordance with certain aspects disclosed herein.

FIG. 24 illustrates a third example of a charging surface 2400 of a wireless charger that includes one or more sensors $2412_1$-$2412_n$ used for detecting device removal. The sensors $2412_1$-$2412_n$ can measure small changes in movement or vibration caused when a receiving device 2406 or other object is picked up or otherwise removed from the charging surface 2400. In one example, sensors $2412_1$-$2412_n$ are placed between transmitter coils $2404_1$-$2404_n$ and a circuit board 2402.

In some implementations, the sensors $2412_1$-$2412_n$ may support or enhance removal detection techniques based on measurements of charging current, tank voltages and/or power draw. The use of sensors $2412_1$-$2412_n$ may improve reliability, efficiency and can reduce power consumption and processor loading.

Figure 25:
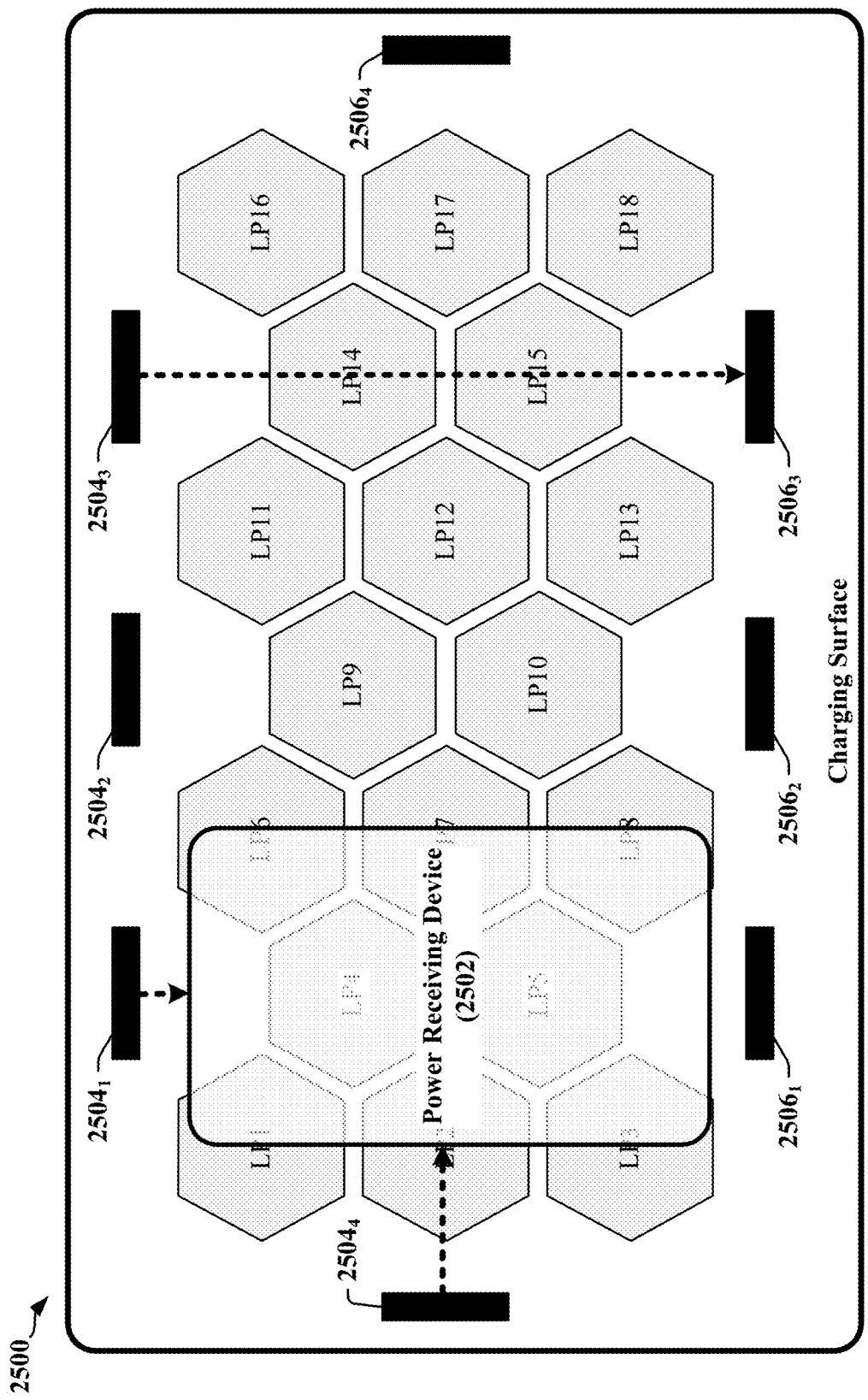
FIG. 25 illustrates a fourth example of the use of sensors to detect removal of a receiving device during power transfer in accordance with certain aspects disclosed herein.

FIG. 25 illustrates a fourth example of a charging surface 2500 of a wireless charger that includes one or more devices $2504_1$-$2504_4$ and/or $2506_1$-$2506_4$ that may be used for detecting device removal. The devices $2504_1$-$2504_4$ and/or $2506_1$-$2506_4$ may include infrared and/or ultrasonic transmitting and sensing devices located co-planar with an exterior surface of the charging surface 2500. In the illustrated example, the transmitting devices $2504_1$-$2504_4$ direct infrared or ultrasonic beams to set of sensing devices $2506_1$-$2506_4$. One or more beams may be interrupted when a receiving device 2502 is placed on the charging surface 2500 between corresponding pairs of the devices $2504_1$-$2504_4$ and/or $2506_1$-$2506_4$. Removal of the receiving device 2502 enables one or more of the sensing devices $2506_1$-$2506_4$ to detect a transmitted beam.

In some implementations, the devices $2504_1$-$2504_4$ and/or $2506_1$-$2506_4$ may support or enhance removal detection techniques based on measurements of charging current, tank voltages and/or power draw. The use of the devices $2504_1$-$2504_4$ and/or $2506_1$-$2506_4$ may improve reliability, efficiency and can reduce power consumption and processor loading. In some implementations, increased numbers of transmitting and/or sensing devices $2504_1$-$2504_4$ and/or $2506_1$-$2506_4$ can provide improved resolution of device location that may be expressed in X and Y coordinates.

Figure 26:
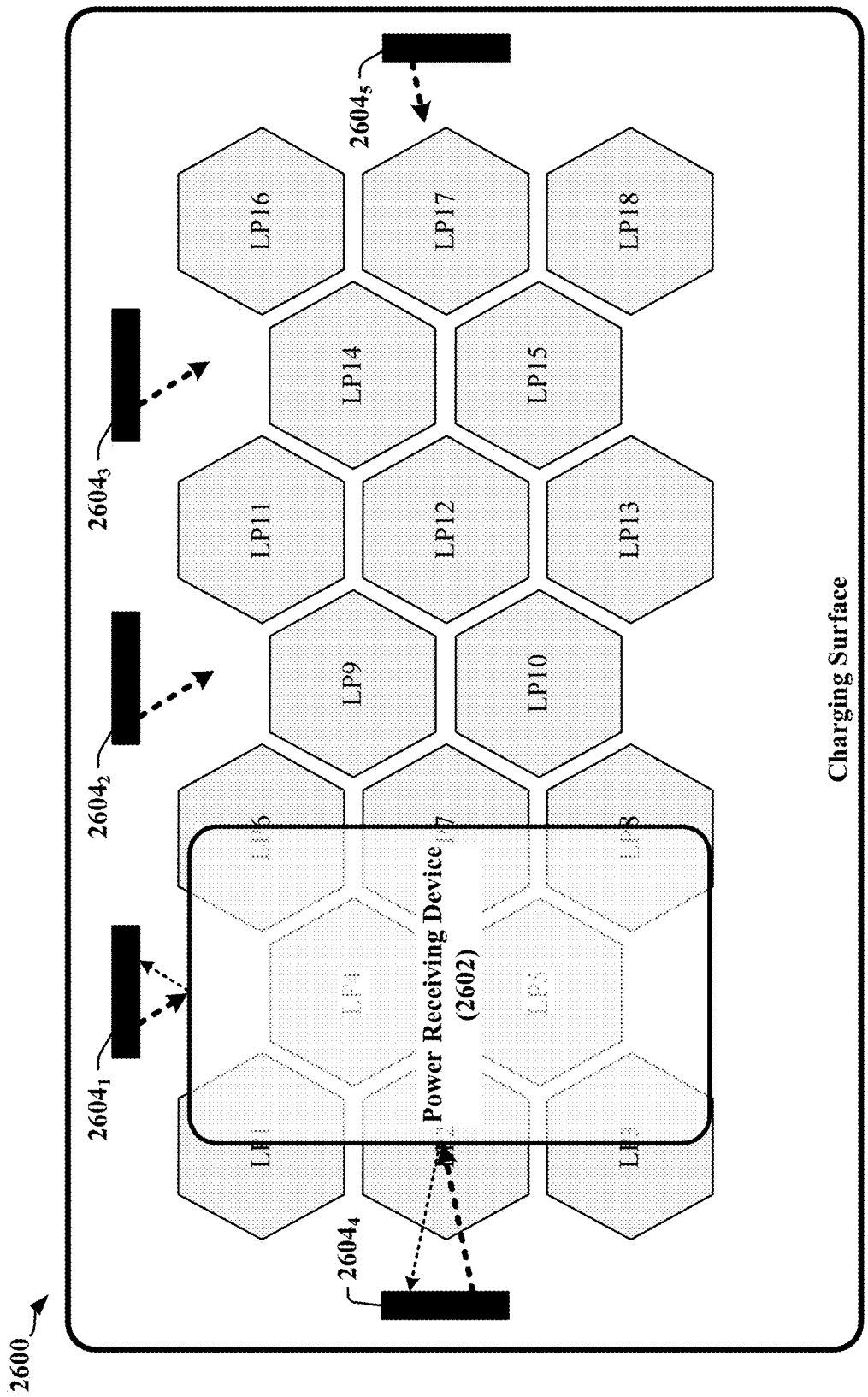
FIG. 26 illustrates a fifth example of the use of sensors to detect removal of a receiving device during power transfer in accordance with certain aspects disclosed herein.

FIG. 26 illustrates a fifth example of a charging surface 2600 of a wireless charger that includes one or more sensing devices $2604_1$-$2604_5$ that may be used for detecting device removal. The sensing devices $2604_1$-$2604_5$ may include infrared and/or ultrasonic combined transmitters and sensors. The sensing devices $2604_1$-$2604_5$ may be located co-planar with an exterior surface of the charging surface 2600. In the illustrated example, sensing devices $2604_1$-$2604_5$ transmit an infrared or ultrasonic beam and are configured to sense characteristics of reflections of the beams. One or more beams may be reflected by a receiving device 2602 placed on the charging surface 2600. The sensing devices $2604_1$-$2604_5$ may detect phase changes, angles of reflection and other characteristics of the reflected beams, thereby permitting detection of the receiving device 2602. Removal of the receiving device 2602 eliminates the reflected beams or modifies the characteristics of the reflected beams.

In some implementations, the sensing devices $2604_1$-$2604_5$ may support or enhance removal detection techniques based on measurements of charging current, tank voltages and/or power draw. The use of the sensing devices $2604_1$-$2604_5$ may improve reliability, efficiency and can reduce power consumption and processor loading. In some implementations, increased numbers of sensing devices $2604_1$-$2604_5$ can provide improved resolution of device location that may be expressed in X and Y coordinates. In some implementations, the sensing devices $2604_1$-$2604_5$ may detect distance between the sensing devices $2604_1$-$2604_5$ and the receiving device 2602, enabling two sensors to determine precise locations of the receiving device 2602.

Example of a Processing Circuit

Figure 27:
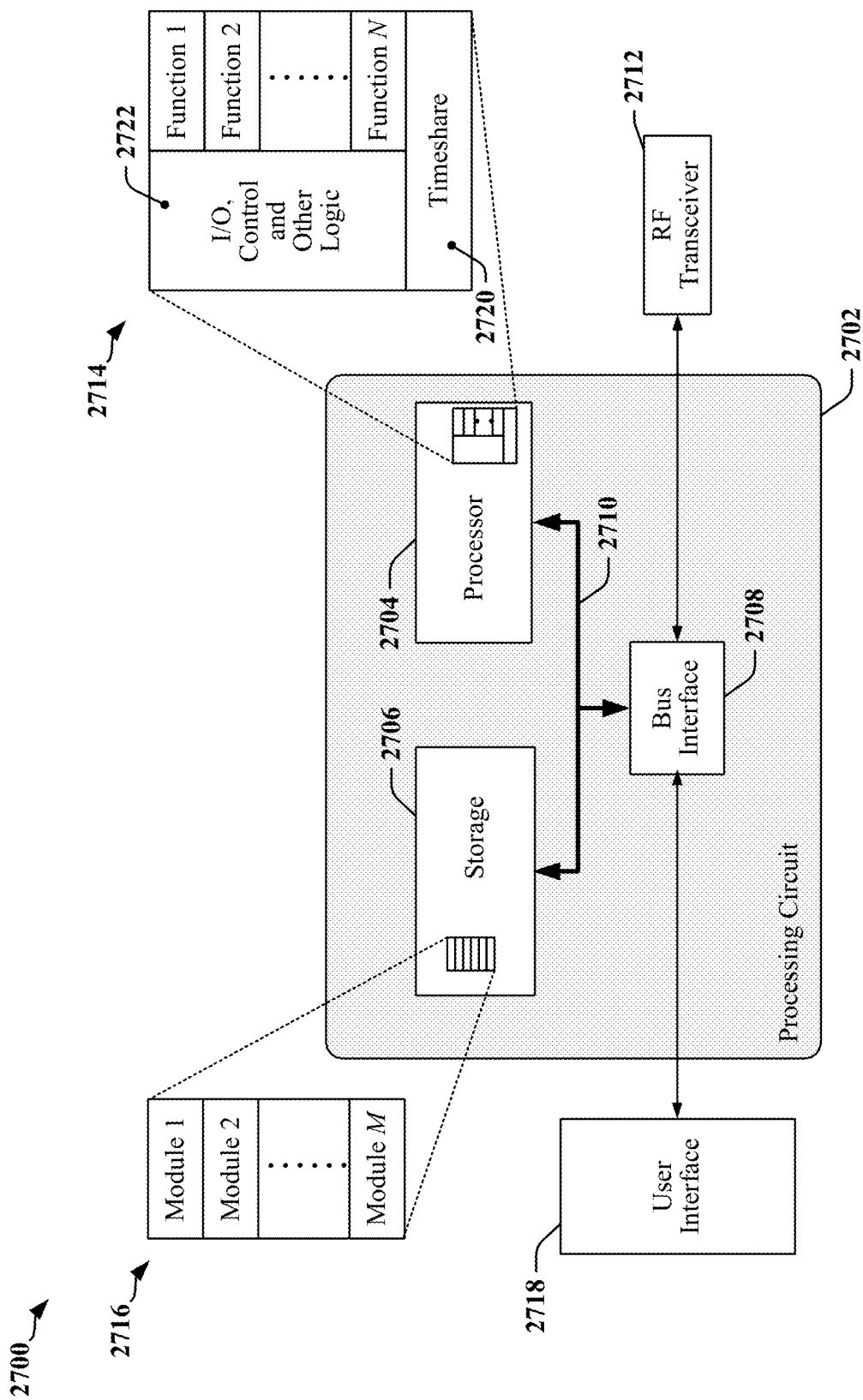
FIG. 27 illustrates one example of an apparatus employing a processing circuit that may be adapted according to certain aspects disclosed herein.

FIG. 27 illustrates an example of a hardware implementation for an apparatus 2700 that may be incorporated in a charging device or in a receiving device that enables a battery to be wirelessly charged. In some examples, the apparatus 2700 may perform one or more functions disclosed herein. In accordance with various aspects of the disclosure, an element, or any portion of an element, or any combination of elements as disclosed herein may be implemented using a processing circuit 2702. The processing circuit 2702 may include one or more processors 2704 that are controlled by some combination of hardware and software modules. Examples of processors 2704 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 2704 may include specialized processors that perform specific functions, and that may be configured, augmented or controlled by one of the software modules 2716. The one or more processors 2704 may be configured through a combination of software modules 2716 loaded during initialization, and further configured by loading or unloading one or more software modules 2716 during operation.

In the illustrated example, the processing circuit 2702 may be implemented with a bus architecture, represented generally by the bus 2710. The bus 2710 may include any number of interconnecting buses and bridges depending on the specific application of the processing circuit 2702 and the overall design constraints. The bus 2710 links together various circuits including the one or more processors 2704, and storage 2706. Storage 2706 may include memory devices and mass storage devices, and may be referred to herein as computer-readable media and/or processor-readable media. The storage 2706 may include transitory storage media and/or non-transitory storage media.

The bus 2710 may also link various other circuits such as timing sources, timers, peripherals, voltage regulators, and power management circuits. A bus interface 2708 may provide an interface between the bus 2710 and one or more transceivers 2712. In one example, a transceiver 2712 may be provided to enable the apparatus 2700 to communicate with a charging or receiving device in accordance with a standards-defined protocol. Depending upon the nature of the apparatus 2700, a user interface 2718 (e.g., keypad, display, speaker, microphone, joystick) may also be provided, and may be communicatively coupled to the bus 2710 directly or through the bus interface 2708.

A processor 2704 may be responsible for managing the bus 2710 and for general processing that may include the execution of software stored in a computer-readable medium that may include the storage 2706. In this respect, the processing circuit 2702, including the processor 2704, may be used to implement any of the methods, functions and techniques disclosed herein. The storage 2706 may be used for storing data that is manipulated by the processor 2704 when executing software, and the software may be configured to implement any one of the methods disclosed herein.

One or more processors 2704 in the processing circuit 2702 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2706 or in an external computer-readable medium. The external computer-readable medium and/or storage 2706 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 2706 may also include, by way of example, a carrier wave, a transmission line, and any other suitable medium for transmitting software and/or instructions that may be accessed and read by a computer. Computer-readable medium and/or the storage 2706 may reside in the processing circuit 2702, in the processor 2704, external to the processing circuit 2702, or be distributed across multiple entities including the processing circuit 2702. The computer-readable medium and/or storage 2706 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2706 may maintain and/or organize software in loadable code segments, modules, applications, programs, etc., which may be referred to herein as software modules 2716. Each of the software modules 2716 may include instructions and data that, when installed or loaded on the processing circuit 2702 and executed by the one or more processors 2704, contribute to a run-time image 2714 that controls the operation of the one or more processors 2704. When executed, certain instructions may cause the processing circuit 2702 to perform functions in accordance with certain methods, algorithms and processes described herein.

Some of the software modules 2716 may be loaded during initialization of the processing circuit 2702, and these software modules 2716 may configure the processing circuit 2702 to enable performance of the various functions disclosed herein. For example, some software modules 2716 may configure internal devices and/or logic circuits 2722 of the processor 2704, and may manage access to external devices such as a transceiver 2712, the bus interface 2708, the user interface 2718, timers, mathematical coprocessors, and so on. The software modules 2716 may include a control program and/or an operating system that interacts with interrupt handlers and device drivers, and that controls access to various resources provided by the processing circuit 2702. The resources may include memory, processing time, access to a transceiver 2712, the user interface 2718, and so on.

One or more processors 2704 of the processing circuit 2702 may be multifunctional, whereby some of the software modules 2716 are loaded and configured to perform different functions or different instances of the same function. The one or more processors 2704 may additionally be adapted to manage background tasks initiated in response to inputs from the user interface 2718, the transceiver 2712, and device drivers, for example. To support the performance of multiple functions, the one or more processors 2704 may be configured to provide a multitasking environment, whereby each of a plurality of functions is implemented as a set of tasks serviced by the one or more processors 2704 as needed or desired. In one example, the multitasking environment may be implemented using a timesharing program 2720 that passes control of a processor 2704 between different tasks, whereby each task returns control of the one or more processors 2704 to the timesharing program 2720 upon completion of any outstanding operations and/or in response to an input such as an interrupt. When a task has control of the one or more processors 2704, the processing circuit is effectively specialized for the purposes addressed by the function associated with the controlling task. The timesharing program 2720 may include an operating system, a main loop that transfers control on a round-robin basis, a function that allocates control of the one or more processors 2704 in accordance with a prioritization of the functions, and/or an interrupt driven main loop that responds to external events by providing control of the one or more processors 2704 to a handling function.

In one implementation, the apparatus 2700 includes or operates as a wireless charging device that has a battery charging power source coupled to a charging circuit, a plurality of charging cells and a controller, which may be included in one or more processors 2704. The plurality of charging cells may be configured to provide a charging surface. At least one coil may be configured to direct an electromagnetic field through a charge transfer area of each charging cell. The controller may be configured to cause the charging circuit to provide a charging current to a resonant circuit when a receiving device is placed on the charging surface, provide a measurement slot by decreasing or terminating the charging current for a period of time, and determine whether the receiving device has been removed from the charging surface based on measurement of a characteristic of the resonant circuit during the measurement slot, wherein the characteristic of the resonant circuit is representative of electromagnetic coupling between a transmitting coil in the resonant circuit and a receiving coil in the receiving device.

In certain implementations, the resonant circuit includes a transmitting coil. The controller may be further configured to detect a change or rate of change in voltage or current level associated with the resonant circuit, and provide the measurement slot responsive to detecting the change or rate of change in the voltage or current level.

The characteristic of the resonant circuit may be indicative of coupling between the transmitting coil and a receiving coil in the receiving device. In one example, the characteristic of the resonant circuit is a Q-factor. The controller may be further configured to measure a rate of decay of energy stored in the resonant circuit, and determine that the receiving device has been removed from the charging surface when the rate of decay of the energy stored in the resonant circuit corresponds to a rate of decay measured before the receiving device is placed on the charging surface.

In some implementations, the apparatus 2700 has one or more sensors located proximate to an exterior surface of the charging device. The controller may be further configured to receive measurements from the one or more sensors, and measure the voltage or current level associated with the resonant circuit when one of the measurements indicates physical removal of the receiving device. The sensors may include a strain measuring sensor, an accelerometer, an infrared or ultrasonic sensing element and/or a hall-effect device.

In some implementations, the storage 2706 maintains instructions and information where the instructions are configured to cause the one or more processors 2704 to provide a charging current to a resonant circuit when a receiving device is placed on the charging surface, determine that a change in voltage or current level associated with the resonant circuit indicates a potential removal of the receiving device from the charging surface, provide a measurement slot by decreasing or terminating the charging current for a period of time, and determine whether the receiving device has been removed from the charging surface based on measurement of a characteristic of the resonant circuit during the measurement slot. In one example, the change in the voltage or the current level includes a step change in the voltage or the current level. A low-pass filter may be used to filter short-duration or low-magnitude step changes in a signal representing the voltage or the current level.

In certain implementations, the resonant circuit includes a transmitting coil in the charging surface. The characteristic of the resonant circuit may be indicative of coupling between the transmitting coil and a receiving coil in the receiving device. The instructions may be configured to cause the one or more processors 2704 to determine that the receiving device has been removed from the charging surface when a voltage measured at a terminal of the transmitting coil exceeds a threshold voltage level. In some instances, the threshold voltage level may be maintained by a lookup table. In some instances, the threshold voltage level may be determined when the transmitting coil is electromagnetically uncoupled. In some instances, the threshold voltage level may be determined when the receiving device is first placed on the charging surface.

In certain implementations, the instructions may be configured to cause the one or more processors 2704 to determine that the receiving device has been removed from the charging surface when a current measured in the resonant circuit has a magnitude that is less than a threshold current level. In some instances, the threshold current level is maintained by a lookup table. In one example, the threshold current level may be determined when no object is electromagnetically coupled with a coil in the resonant circuit. In another example, the threshold current level may be determined when the receiving device is first placed on the charging surface.

In some implementations, the instructions may be configured to cause the one or more processors 2704 to determine that the receiving device has been removed from the charging surface based on a rate of decay of energy stored in the resonant circuit. In some implementations, the instructions may be configured to cause the one or more processors 2704 to use a passive ping procedure to determine whether the receiving device has been removed from the charging surface. The passive ping procedure may be performed during the measurement slot and after terminating the charging current. In some implementations, the instructions may be configured to cause the one or more processors 2704 to use a digital ping procedure to determine whether the receiving device has been removed from the charging surface. The digital ping procedure may be performed during the measurement slot and after terminating the charging current.

In certain implementations, the instructions may be configured to cause the one or more processors 2704 to monitor and/or receive measurements from one or more sensors in the charging surface. The instructions may be configured to cause the one or more processors 2704 to measure the voltage or current level associated with the resonant circuit after one of the measurements indicates physical removal of the receiving device. The sensors may include a strain measuring sensor, an accelerometer, an infrared or ultrasonic sensing element and/or a hall-effect device.

Figure 28:
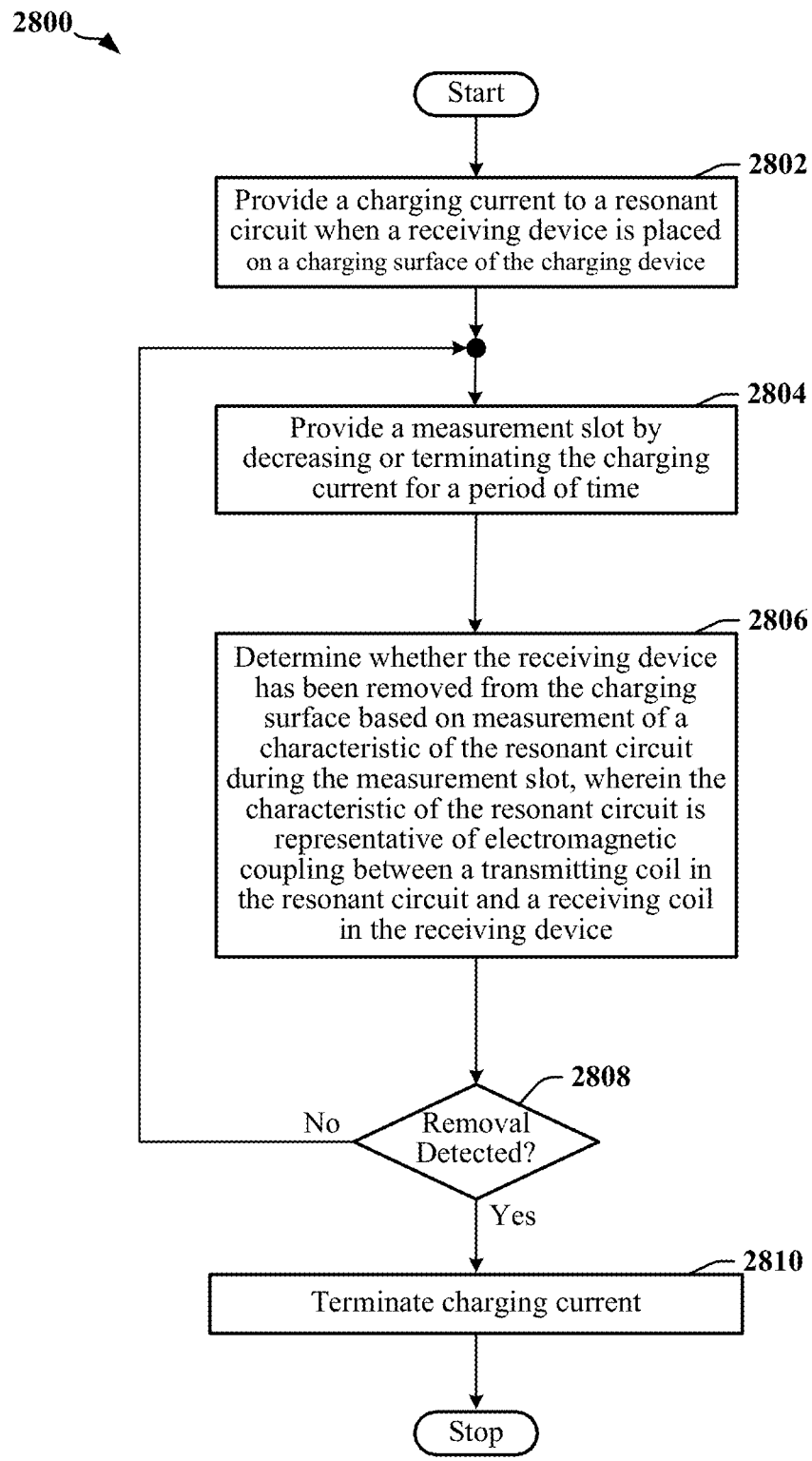
FIG. 28 illustrates a method for operating a charging device in accordance with certain aspects of this disclosure.

FIG. 28 is a flowchart 2800 illustrating a method for operating a charging device in accordance with certain aspects of this disclosure. The method may be performed by a controller in the charging device. At block 2802, the controller may provide a charging current to a resonant circuit when a receiving device is placed on a charging surface of the charging device. At block 2804, the controller may provide a measurement slot by decreasing or terminating the charging current for a period of time. At block 2806, the controller determines whether the receiving device has been removed from the charging surface based on measurement of a characteristic of the resonant circuit during the measurement slot. The characteristic of the resonant circuit may be representative of electromagnetic coupling between a transmitting coil in the resonant circuit and a receiving coil in the receiving device. If at block 2808, the controller determines that the receiving device has been removed from the charging surface, then at block 2810 the controller may terminate the charging current and the charging cycle associated with the receiving device. If at block 2808, the controller determines that the receiving device has not been removed from the charging surface, then the method may continue or resume at block 2804. The resonant circuit may include a transmitting coil.

In certain implementations, the controller may detect a change or rate of change in voltage or current level associated with the resonant circuit, and provide the measurement slot responsive to detecting the change or rate of change in the voltage or current level.

In one example, the characteristic of the resonant circuit is indicative of coupling between the transmitting coil and a receiving coil in the receiving device. In some instances, the characteristic of the resonant circuit includes a Q-factor.

In certain implementations, the controller may measure a rate of decay of energy stored in the resonant circuit, and determine that the receiving device has been removed from the charging surface when the rate of decay of the energy stored in the resonant circuit corresponds to a rate of decay measured before the receiving device is placed on the charging surface.

In certain implementations, the controller may receive measurements from one or more sensors in the charging surface, and may measure the voltage or current level associated with the resonant circuit after one of the measurements indicates physical removal of the receiving device. The sensors may include a strain measuring sensor, an accelerometer, an infrared or ultrasonic sensing element and/or a hall-effect device.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for operating a charging device, comprising:
   transferring power to a receiving device in accordance with a charging configuration, including providing a charging current to a resonant circuit according to the charging configuration, the charging configuration being generated after determining that the receiving device has been placed at a first location on a charging surface of the charging device;
   detecting a change or rate of change in voltage or current level associated with the resonant circuit while transferring power to the receiving device;
   initiating a measurement slot by terminating the charging current for a period of time after detecting the change or rate of change in the voltage or current level;
   determining whether the receiving device has been removed from the charging surface based on a change in Q-factor of the resonant circuit determined using measurements obtained during the measurement slot;
   resuming power transfer to the receiving device in accordance with the charging configuration by resuming the charging current to the resonant circuit when the Q-factor of the resonant circuit indicates that the receiving device remains on the charging surface; and
   discontinuing power transfer to the receiving device after determining that the receiving device has been moved from the first location.

2. The method of claim 1, wherein the measurement slot is initiated when the rate of change in the voltage or current level associated with the resonant circuit exceeds a threshold rate of change.

3. The method of claim 1, wherein the resonant circuit includes a transmitting coil.

4. The method of claim 3, wherein the Q factor of the resonant circuit is indicative of coupling between the transmitting coil and a receiving coil in the receiving device.

5. The method of claim 1, wherein the receiving device is determined to have been removed from the charging surface based on a comparison of the Q-factor of the resonant circuit with a reference Q-factor.

6. The method of claim 3, further comprising:
   measuring a rate of decay of energy stored in the resonant circuit; and
   determining that the receiving device has been removed from the charging surface when a difference between the rate of decay of the energy stored in the resonant circuit and a rate of decay measured before the receiving device is placed on the charging surface exceeds a threshold difference.

7. The method of claim 1, further comprising:
   receiving measurements from one or more sensors in the charging surface; and
   providing the measurement slot when one of the measurements indicates physical removal of the receiving device.

8. The method of claim 7, wherein the one or more sensors include a strain measuring sensor.

9. The method of claim 7, wherein the one or more sensors include an accelerometer.

10. The method of claim 7, wherein the one or more sensors comprise an infrared or ultrasonic sensing element.

11. The method of claim 7, wherein the one or more sensors comprise a hall-effect device.

12. A charging device, comprising:
    a charging circuit;
    a resonant circuit coupled to the charging circuit; and
    a controller configured to:
       cause the charging circuit to provide a charging current to the resonant circuit when a receiving device is placed at a first location on a charging surface of the charging device;
       detect a change or rate of change in voltage or current level associated with the resonant circuit while transferring power to the receiving device;
       initiate a measurement slot by causing the charging circuit to terminate the charging current for a period of time;
       determine whether the receiving device has been removed from the charging surface based on a change in Q-factor of the resonant circuit determined using measurements obtained during the measurement slot;
       cause the charging circuit to resume power transfer to the receiving device in accordance with the charging configuration by resuming the charging current to the resonant circuit when the Q-factor of the resonant circuit indicates that the receiving device remains on the charging surface; and
       cause the charging circuit to discontinue power transfer to the receiving device after determining that the receiving device has been moved from the first location.

13. The charging device of claim 12, wherein the controller is further configured to:
    initiate the measurement slot after determining that the change or rate of change in the voltage or current level associated with the resonant circuit exceeds a threshold rate of change.

14. The charging device of claim 12, wherein the resonant circuit includes a transmitting coil.

15. The charging device of claim 14, wherein the Q-factor of the resonant circuit is indicative of coupling between the transmitting coil and a receiving coil in the receiving device.

16. The charging device of claim 12, wherein the receiving device is determined to have been removed from the charging surface based on a comparison of the Q-factor of the resonant circuit with a reference Q-factor.

17. The charging device of claim 14, wherein the controller is further configured to:

measure a rate of decay of energy stored in the resonant circuit; and determine that the receiving device has been removed from the charging surface when a difference between the rate of decay of the energy stored in the resonant circuit and a rate of decay measured before the receiving device is placed on the charging surface exceeds a threshold difference.

18. The charging device of claim 12, further comprising:

one or more sensors configured to measure a change in a physical characteristic affected by presence of the receiving device, wherein the controller is further configured to:

receive measurements from the one or more sensors; and provide the measurement slot when one of the measurements indicates physical removal of the receiving device.

19. The charging device of claim 18, wherein the one or more sensors include a strain measuring sensor.

20. The charging device of claim 18, wherein the one or more sensors include an accelerometer.

21. The charging device of claim 18, wherein the one or more sensors comprise an infrared or ultrasonic sensing element.

22. The charging device of claim 18, wherein the one or more sensors comprise a hall-effect device.

* * * * *